(12) United States Patent
Chen et al.

(10) Patent No.: US 12,165,980 B2
(45) Date of Patent: Dec. 10, 2024

(54) SEMICONDUCTOR PACKAGE AND METHODS OF MANUFACTURING

(71) Applicant: Taiwan Semiconductor Manufacturing Company, Ltd., Hsinchu (TW)

(72) Inventors: Hsien-Wei Chen, Hsinchu (TW); Meng-Liang Lin, Hsinchu (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 167 days.

(21) Appl. No.: 17/661,858

(22) Filed: May 3, 2022

(65) Prior Publication Data

US 2023/0361045 A1 Nov. 9, 2023

(51) Int. Cl.
*H01L 23/538* (2006.01)
*H01L 23/00* (2006.01)
*H01L 23/498* (2006.01)

(52) U.S. Cl.
CPC .... *H01L 23/5383* (2013.01); *H01L 23/49822* (2013.01); *H01L 23/49827* (2013.01); *H01L 23/49866* (2013.01); *H01L 24/16* (2013.01); *H01L 24/13* (2013.01); *H01L 2224/13111* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16227* (2013.01)

(58) Field of Classification Search
CPC .......... H01L 23/5383; H01L 23/49822; H01L 23/49827; H01L 23/49866; H01L 24/16; H01L 24/13; H01L 2224/16227; H01L 22/14; H01L 22/32; H01L 23/5385; H01L 24/81; H01L 23/49816
See application file for complete search history.

(56) References Cited

U.S. PATENT DOCUMENTS

2013/0342231 A1* 12/2013 Alfano ................ H05K 1/0268
  324/750.16
2019/0131194 A1* 5/2019 Ding ................ H01L 23/49827

* cited by examiner

*Primary Examiner* — Douglas W Owens
(74) *Attorney, Agent, or Firm* — Harrity & Harrity, LLP

(57) ABSTRACT

A semiconductor package, which may correspond to a high-performance computing package, includes an integrated circuit die electrically and/or mechanically connected to a top surface of an interposer and a plurality of connection structures electrically and/or mechanically connected to a bottom surface of the interposer. The top surface of the interposer includes a set of test contact structures (e.g., one or more test bumps) that are electrically connected to the integrated circuit die through traces of the interposer. The set of test structures may be contacted by a probe needle to test a quality and/or a reliability of the integrated circuit die, as well as verify that traces of the interposer are functional. The set of test contact structures allows the integrated circuit die and traces of the interposer to be tested without probing the connection structures.

20 Claims, 19 Drawing Sheets

SEMICONDUCTOR PACKAGE AND METHODS OF MANUFACTURING

BACKGROUND

A high-performance computing (HPC) semiconductor package may include one or more integrated circuit (IC) dies, or chips, from a semiconductor wafer, such as a system-on-chip (SoC) IC die, a dynamic random access memory (DRAM) IC die, or a high bandwidth memory (HBM) IC die. The HPC semiconductor package may include an interposer that provides an interface between the one or more IC dies and a substrate. The HPC semiconductor package may further include one or more connection structures to provide electrical connectivity for signaling between the one or more IC dies, the interposer, and the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
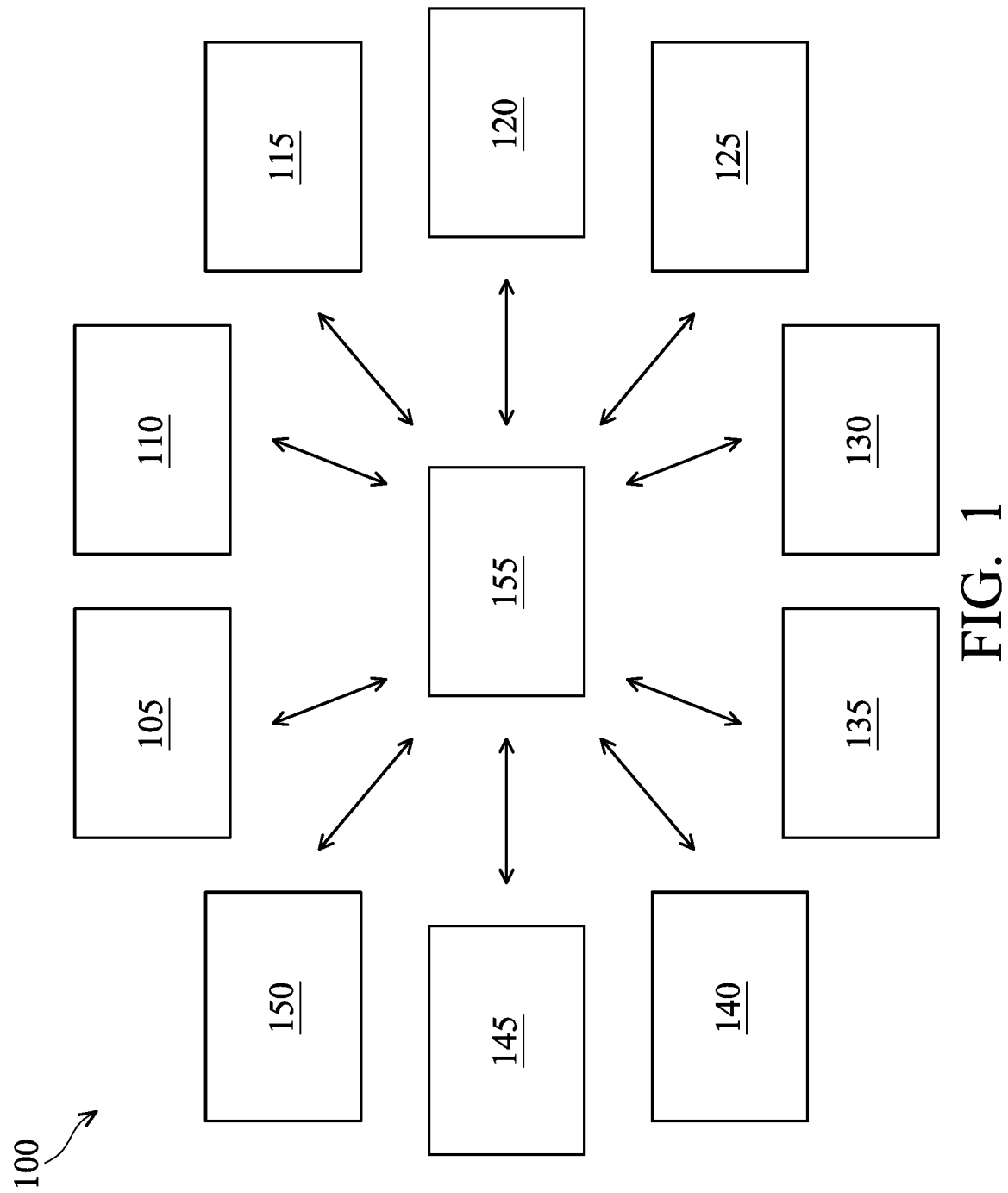
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Known good die (KGD) testing operations are often implemented during manufacturing of a semiconductor package, such as an HPC semiconductor package, to ensure a quality and reliability of an IC die prior to encapsulating the IC die with a mold compound. In some cases, and during a step at which the semiconductor package is partially formed, the IC die may be attached to an interposer. In such cases, the KGD testing operations may access and test circuitry of the IC die by probing connection structures (e.g., controlled collapse of chip connection (C4) connection structures, among other examples) attached to a bottom side of the interposer. This probing may, however, cause damage to the connection structures that decreases a quality and/or a reliability of the semiconductor package during a subsequent manufacturing step. For example, during a process that reflows the connection structures to join the interposer to the substrate, air pockets and/or discontinuities from the damage may decrease a reliability of solder joints between the connection structures and the substrate.

Some implementations herein describe a semiconductor package. The semiconductor package, which may correspond to a high-performance computing (HPC) package, includes an IC die electrically and/or mechanically connected to a top surface of an interposer and a plurality of connection structures electrically and/or mechanically connected to a bottom surface of the interposer. The top surface of the interposer includes a set of test contact structures (e.g., one or more test bumps) that are electrically connected to the IC die through traces of the interposer. The set of test structures may be contacted by a probe needle to test a quality and/or a reliability of the IC die, as well as verify that traces of the interposer are functional. The set of test contact structures allows the IC die and traces of the interposer to be tested without probing the connection structures.

In this way, damage to the connection structures from probing may be avoided to improve a reliability and/or a quality of solder joints between the connection structures and a substrate to which the interposer is subsequently mounted. As such, a yield of the semiconductor package including the set of test contact structures may improve and a cost of the semiconductor package including the set of test contact structures may decrease.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an interconnect tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a series of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a series of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical interconnect access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, or a plating tool, among other examples). The RDL tool set 105 may further include a bonding/debonding tool for joining, and/or separating, semiconductor substrates (e.g., semiconductor wafers). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The interconnect tool set 115 includes one or more tools that are capable of forming connection structures (e.g., electrically-conductive structures) as part of the semiconductor package. The connection structures formed by the interconnect tool set 115 may include a wire, a stud, a pillar, a bump, or a solderball, among other examples. The connection structures formed by the interconnect tool set 115 may include materials such as a gold (Au) material, a copper (Cu) material, a silver (Ag) material, a nickel (Ni) material, a tin (Sn) material, or a palladium (Pd) material, among other examples. The interconnect tool set 115 may include a bumping tool, a wirebond tool, or a plating tool, among other examples. In some implementations, the example environment 100 includes a plurality of types of such tools as part of the interconnect tool set 115.

The ATE tool set 120 includes one or more tools that are capable of testing a quality and a reliability of the one or more IC dies and/or the semiconductor package (e.g., the one or more IC dies after encapsulation). The ATE tool set 120 may perform wafer testing operations, known good die (KGD) testing operations, semiconductor package testing operations, or system-level (e.g., a circuit board populated with one or more semiconductor packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor package from a leadframe. Additionally, or alternatively, the singulation tool set 125 may include a router tool or a laser tool that removes the semiconductor package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies to the interposer, the leadframe, and/or the strip of the organic substrate material, among other examples. The die-attach tool set 130 may include a pick-and-place tool, a taping tool, a laminating tool, a reflow tool (e.g., a furnace), a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density interconnect (HDI) PCB, among other examples. In some implementations, the PCB tool set 140 forms the interposer and/or the substrate. The PCB tool set 140 may include a laminating tool, a plating tool, a photoengraving tool, a laser cutting tool, a pick-and-place tool, an etching tool, a dispense tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or smore transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform a series of operations. For example, and as described in greater detail in connection with FIGS. 3A-8 and elsewhere herein, the series of operations includes attaching an IC die to a top surface of an interposer using a set of connection structures, where the set of connection structures electrically connects first circuitry of the IC die to first electrically-conductive traces of the interposer. The method includes testing the IC die using a set of test contact structures attached to the top surface of the interposer and adjacent the IC die, where the set of test contact structures electrically connects to second circuitry of the integrated circuit die through second electrically-conductive traces of the interposer. The method includes determining that the IC die satisfies a quality and/or reliability threshold based on a result of testing the IC die. The method includes encapsulating the IC die, the set of connection structures, and the set of test contact structures within a mold compound after determining that the integrated circuit die satisfies the quality and/or reliability threshold.

Additionally, or alternatively, the series of operations includes bonding a first carrier to an interposer, where a top surface of the first carrier interfaces with a bottom surface of the interposer. The series of operations includes attaching an IC die to a top surface of the interposer using a first set of connection structures. The series of operations includes testing the IC die using a set of test contact structures attached to the top surface of the interposer and adjacent the integrated circuit die. The series of operations includes determining that the IC die satisfies a quality and/or reliability threshold based on a result of testing the IC die. The series of operations may include encapsulating the IC die, the first set of connection structures, and the set of test contact structures within a mold compound after determining that the IC die satisfies the quality and/or reliability threshold. The series of operations includes planarizing the mold compound to expose the IC die. The series of operations includes debonding the first carrier from the interposer. The series of operations includes bonding a second carrier to the mold compound and the IC die, where a top surface of the mold compound and a top surface of the IC die interface with a bottom surface of the second carrier. The series of operations includes forming a second set of connection structures on a bottom surface of the interposer. The series of operations includes debonding the second carrier from the mold compound and the IC die.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2:
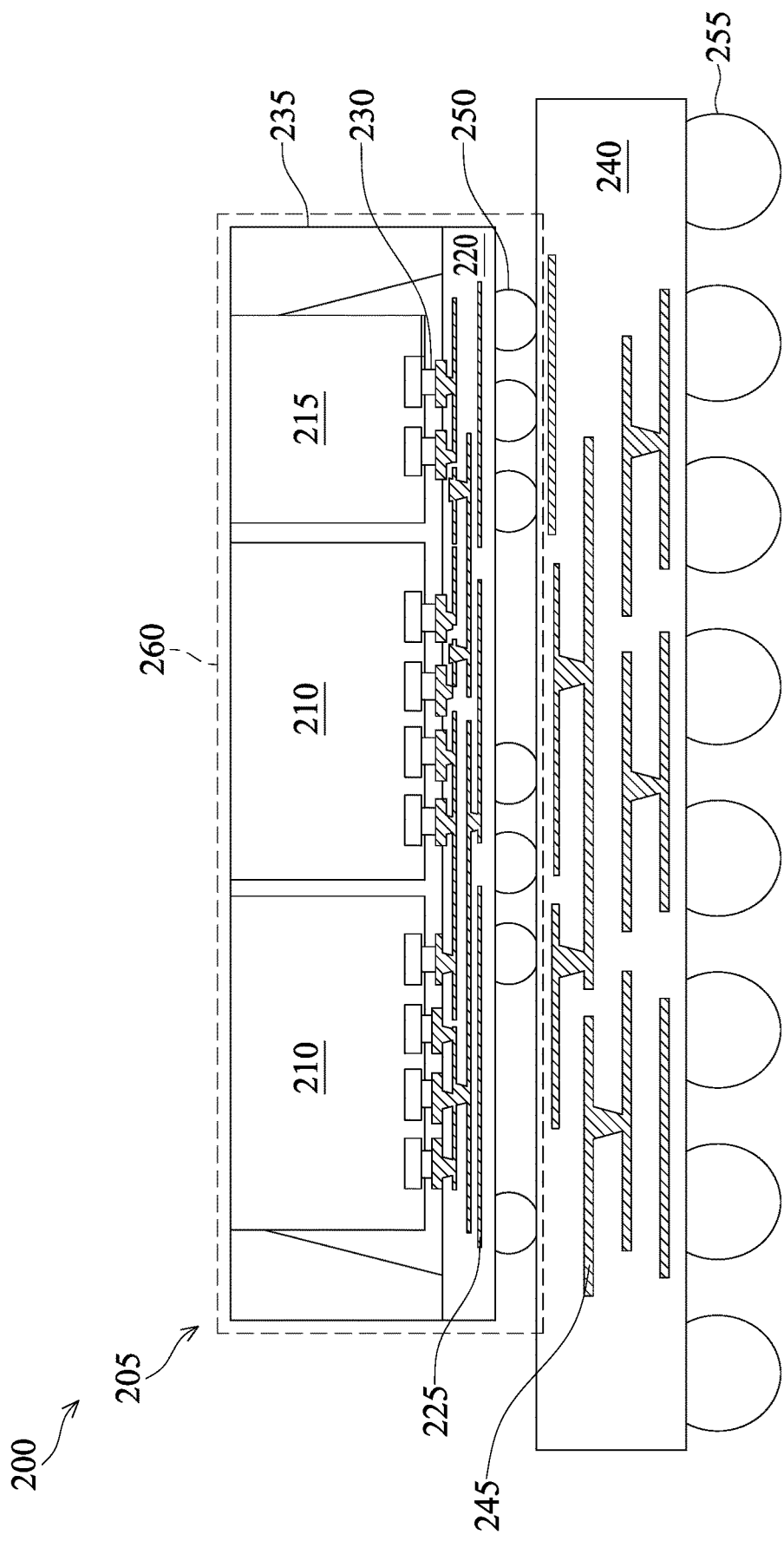
FIG. 2 is a diagram of an example implementation of a semiconductor package described herein.

FIG. 2 is a diagram of an example implementation 200 of a semiconductor package 205 described herein. In some implementations, the semiconductor package 205 corresponds to a high-performance computing (HPC) semiconductor package. Furthermore, FIG. 2 represents a side view of the semiconductor package 205.

The semiconductor package 205 may include one or more IC dies (e.g., a system-on-chip (SoC) IC die 210 and/or a dynamic random access memory (DRAM) IC die 215, among other examples). The semiconductor package 205 may include an interposer 220 having one or more layers of electrically-conductive traces 225. The interposer 220 may include one or more layers of a dielectric material, such as a ceramic material or a silicon material. In some implementations, the interposer 220 corresponds to a PCB including layers of a glass-reinforced epoxy laminate material and/or a pre-preg material (e.g., a composite fiber/resin/epoxy material), among other examples. Additionally, or alternatively, one or more layers of the interposer 220 may include a buildup film material.

The electrically-conductive traces 225 may include one or more materials such as a gold (Au) material, a copper (Cu) material, a silver (Ag) material, a nickel (Ni) material, a tin (Sn) material, or a palladium (Pd) material, among other examples. In some implementations, the interposer 220 includes one or more conductive vertical access connection structures (vias) that connect one or more layers of the electrically-conductive traces 225.

As shown in FIG. 2, the SoC IC die 210 and the DRAM IC die 215 are connected (e.g., mounted) to the interposer 220 using a plurality of connection structures 230. The connection structures 230 may include one or more combinations of a stud, a pillar, a bump, or a solderball, among other examples. The connection structures 230 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 230 may connect lands (e.g., pads) on bottom surfaces of the SoC IC die 210 and the DRAM IC die 215 to lands on a top surface of the interposer 220. In some implementations, the connection structures 230 may include one or more electrical connections for signaling (e.g., corresponding lands of the SoC IC die 210, the DRAM IC die 215, and the interposer 220 are electrically connected to respective circuitry and/or traces of the SoC IC die 210, the DRAM IC die 215, and the interposer 220).

In some implementations, the connection structures 230 may include one or more mechanical connections for attachment purposes and/or spacing purposes (e.g., corresponding lands of the SoC IC die 210, the DRAM IC die 215, and the interposer 220 are not electrically connected to respective circuitry and/or traces of the SoC IC die 210, the DRAM IC die 215, and the interposer 220). In some implementations, one or more of the connection structures 230 may function both electrically and mechanically.

A mold compound 235 may encapsulate one or more portions of the semiconductor package 205, including portions of the SoC IC die 210 and/or the DRAM IC die 215. The mold compound 235 (e.g., a plastic mold compound, among other examples) may protect the SoC IC die 210 and/or the DRAM IC die 215 from damage during manufacturing of the semiconductor package 205 and/or during field use of the semiconductor package 205.

The semiconductor package 205 may include a substrate 240 having one or more layers of electrically-conductive traces 245. The substrate 240 may include one or more layers of a dielectric material, such as a ceramic material or a silicon material. In some implementations, the substrate 240 corresponds to a PCB including layers of a glass-reinforced epoxy laminate material and/or a pre-preg material (e.g., a composite fiber/resin/epoxy material), among other examples. Additionally, or alternatively, one or more layers of the substrate 240 may include a buildup film material.

The electrically-conductive traces 245 may include one or more materials such as a gold (Au) material, a copper (Cu) material, a silver (Ag) material, a nickel (Ni) material, a tin (Sn) material, or a palladium (Pd) material, among other examples. In some implementations, the substrate 240 includes one or more conductive vertical access connection structures (vias) that connect one or more layers of the electrically-conductive traces 245.

As shown in FIG. 2, the interposer 220 is connected (e.g., mounted) to the substrate 240 using a plurality of connection structures 250. The connection structures 250 may include one or more combinations of a stud, a pillar, a bump, or a solderball, among other examples. In some implementations, the connection structures 250 correspond to controlled collapse chip connection (C4) connection structures. The connection structures 250 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The connection structures 250 may connect lands (e.g., pads) on a bottom surface of the interposer 220 to lands on a top surface of the substrate 240. In some implementations, the connection structures 250 may include one or more electrical connections for signaling (e.g., corresponding lands of the interposer 220 and the substrate 240 are electrically connected to respective circuitry and/or traces of the interposer 220 and the substrate 240). In some implementations, the connection structures 250 may include or more mechanical connections for attachment purposes and/or spacing purposes (e.g., corresponding lands of the interposer 220 and the substrate 240 are not electrically connected to respective circuitry and/or traces of the interposer 220 and the substrate 240). In some implementations, one or more of the connection structures 250 may function both electrically and mechanically.

The semiconductor package 205 may include a plurality of connection structures 255 connected to lands (e.g., pads) on a bottom surface of the substrate 240. The connection structures 255 may include one or more combinations of a stud, a pillar, a bump, or a solderball, among other examples. The connection structures 255 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free). In some implementations, the connection structures 255 correspond to C4 connection structures.

The connection structures 255 may be used to attach the semiconductor package 205 (e.g., the substrate 240) to a circuit board (not shown) using a surface mount (SMT) process. In some implementations, the connection structures 255 may provide an electrical connection for signaling (e.g., corresponding lands of the substrate 240 and the circuit board may be electrically connected to respective circuitry and/or traces of the substrate 240 and the circuit board). In some implementations, the connection structures 255 may provide a mechanical connection to the circuit board for attachment purposes and/or spacing purposes (e.g., corresponding lands of the substrate 240 and the circuit board may not be electrically connected to respective circuitry and/or traces of the substrate 240 and the circuit board). In some implementations, one or more of the connection structures 255 may provide both mechanical and electrical connections.

The semiconductor package 205 may include a region 260 having one or more additional features. As described in greater detail in connection with FIGS. 3A-3D, and elsewhere herein, the semiconductor package 205 (e.g., a region 260 of the semiconductor package 205) includes an IC die (e.g., the DRAM IC die 215, among other examples) having a bottom surface. The semiconductor package includes an integrated circuit die having a bottom surface. The semiconductor package 205 includes an interposer (e.g., the interposer 220) having a top surface. The semiconductor package 205 includes a set of connection structures (e.g., the connection structures 230) between the top surface of the interposer and the bottom surface of the IC die, where the set of connection structures electrically connects first electrically-conductive traces (e.g., a first subset of the electrically-conductive traces 225) of the interposer to the IC die. The semiconductor package includes a set of test contact structures attached to the top surface of the interposer, where the set of test contact structures and the IC die are disposed side by side, and where the set of test contact structures electrically connects to the IC die through second electrically-conductive traces (e.g., a second subset of the electrically-conductive traces 225) of the interposer.

As indicated above, FIG. 2 is provided as an example. Other examples may differ from what is described with regard to FIG. 2.

FIGS. 3A-3D are diagrams of an example implementation 300 described herein. Example implementation 300 may include the region 260 of the semiconductor package 205 formed using a combination of operations performed by one or more of the semiconductor processing tools 105-150 as described in connection with FIG. 1.

Figure 3A:
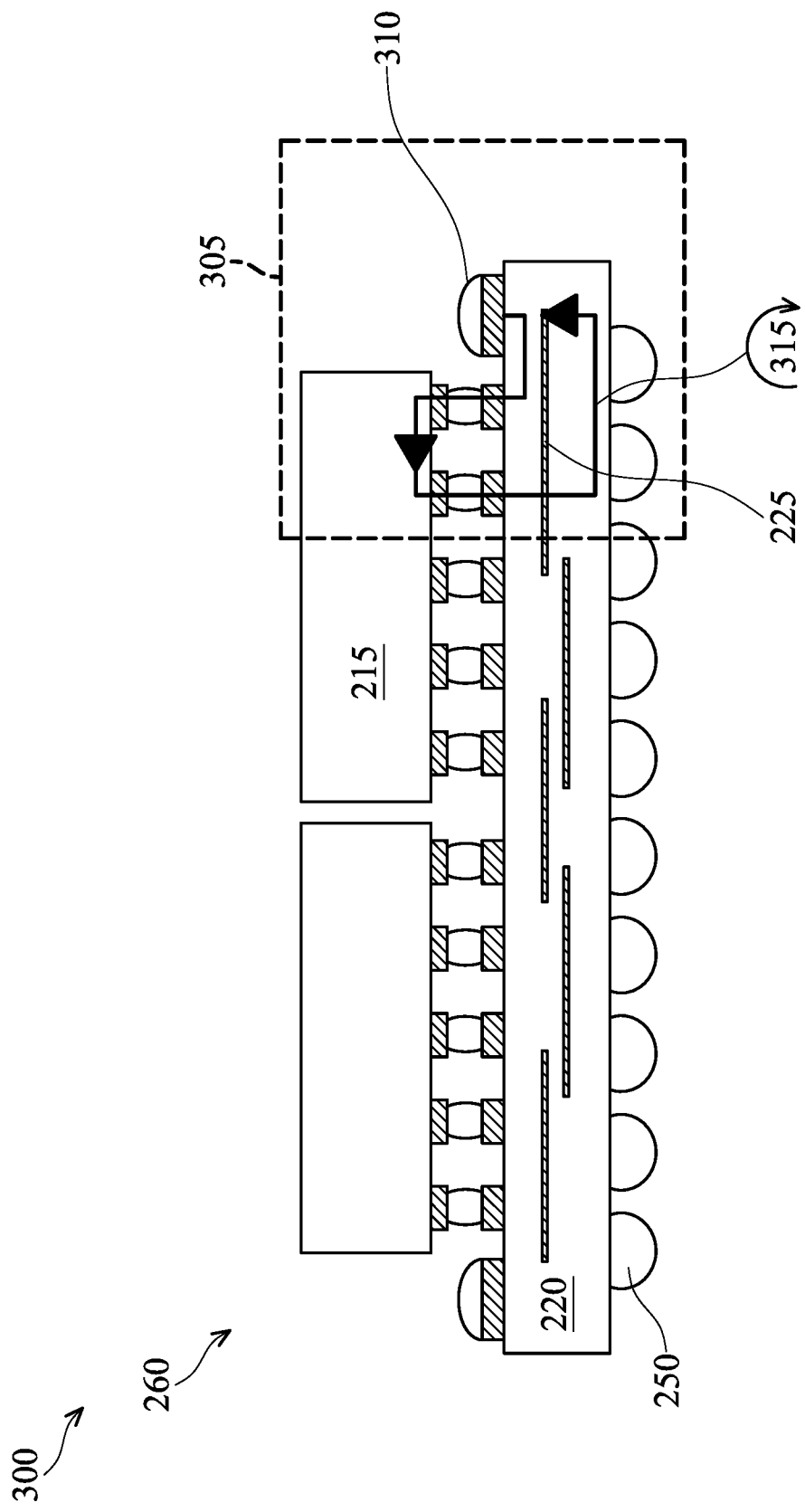
FIGS. 3A-3D, 4A-4C, and 5A-5G are diagrams of example implementations described herein.

As shown in the side view of FIG. 3A, a portion 305 of the region 260 of the semiconductor package 205 includes a set of test contact structures 310. The set of test contact structures 310 is on a top surface of the interposer 220 and adjacent to the IC die (e.g., the DRAM IC die 215, among other examples). As shown in FIG. 3A, the set of test contact structures 310 and the IC die are disposed side by side.

The set of test contact structures 310 may include a quantity of one or more structures. In some implementations, the set of test contact structures 310 includes at least one structure corresponding to a bump-shaped structure (e.g., a structure having a convex surface). In some implementations, the set of test contact structures 310 includes at least one structure corresponding to a pad-shaped structure (e.g., a structure having a planar surface).

The set of test contact structures 310 may include a material composition of one or more electrically-conductive materials, such as a gold (Au) material, a copper (Cu) material, a silver (Ag) material, a nickel (Ni) material, a tin (Sn) material, a lead (Pb) material, a palladium (Pd) material, a material composed of a combination of electrically-conductive materials, among other examples. In some implementations, a material composition of the set of test contact structures 310 is different than a material composition of the connection structures 230. Additionally, the set of test contact structures 310 may be formed on the top surface of the interposer 220 using the interconnect tool set 115 such as the plating tool or the bumping tool, among other examples.

Figure 3B:
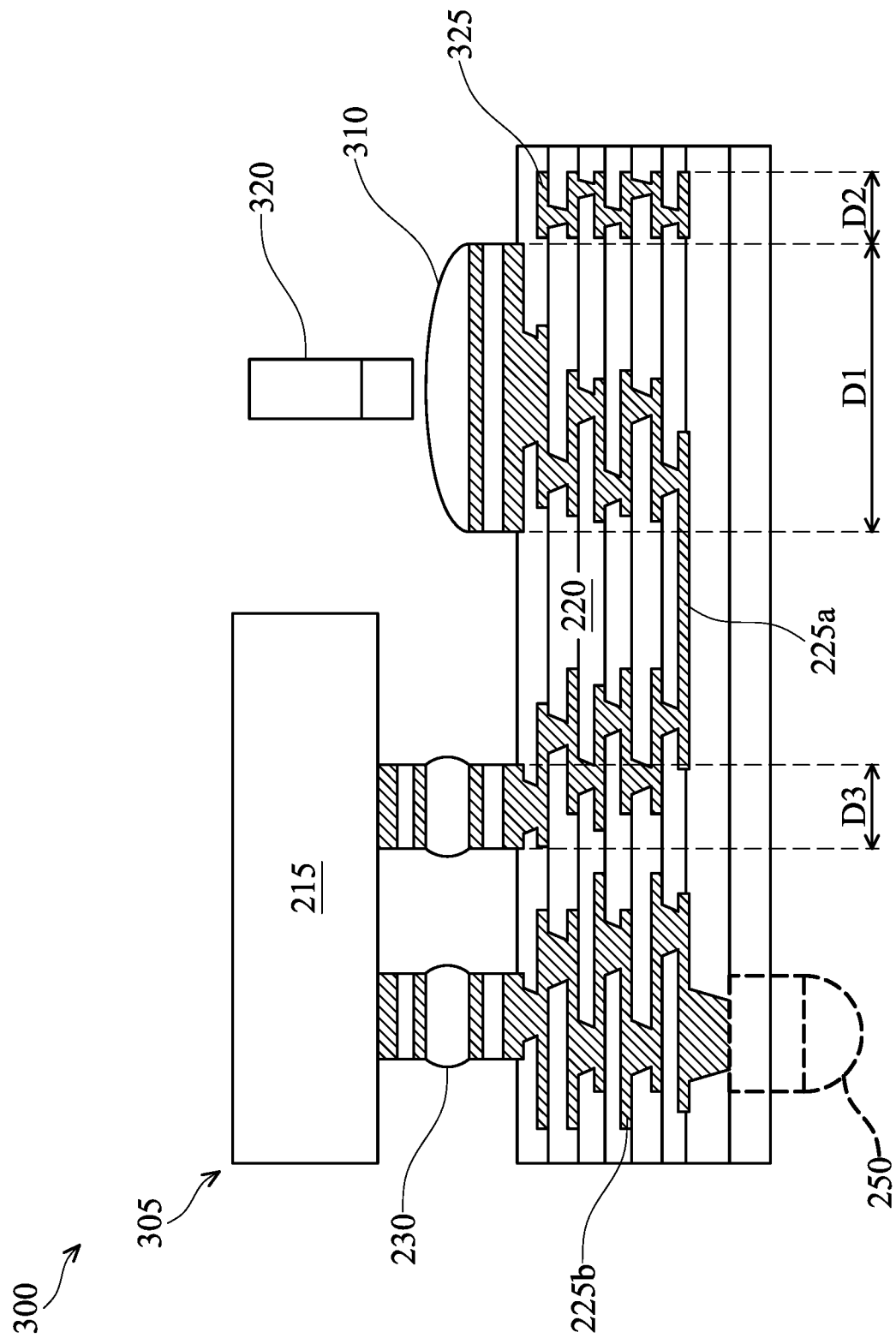
Figure 3C:
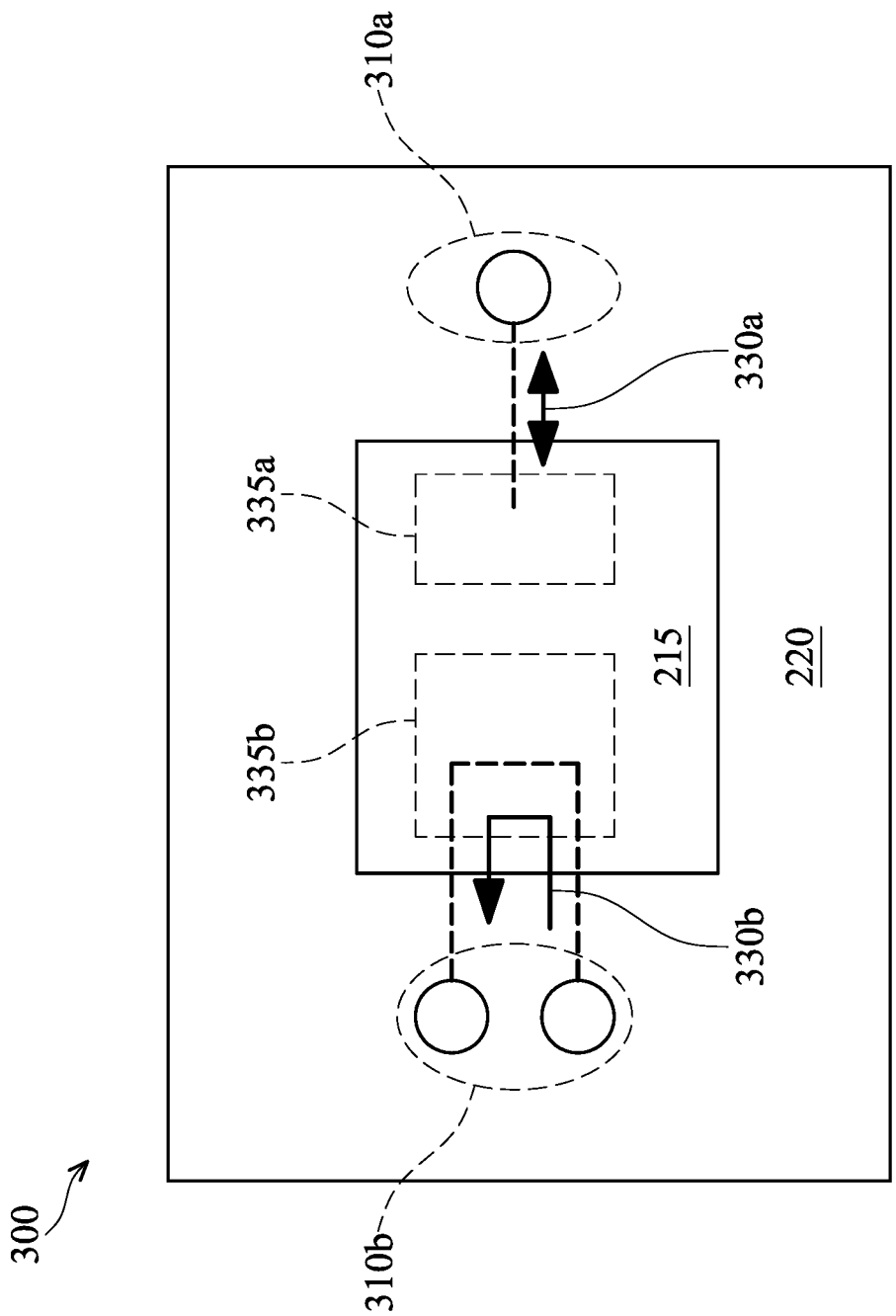

As shown in FIG. 3A, and as described in additional detail in connection with FIGS. 3B and 3C, a testing operation 315 may be performed using the set of test contact structures 310. The testing operation 315 may correspond to a known good die (KGD) testing operation that tests a quality or reliability of the IC die. Additionally, or alternatively, the testing operation 315 may test a functionality of the electrically-conductive traces 225. Using the interposer 220 including the set of test contact structures 310 during the testing operation 315, and prior to encapsulating the IC die, provides an opportunity to gain one or more cost efficiencies related to a semiconductor package (e.g., the semiconductor package 205) and/or the IC die. As an example, if the IC die fails to satisfy a quality threshold or a reliability threshold, the IC die may be replaced (e.g., "reworked") with another IC die to salvage the interposer 220 and/or one or more other IC dies attached to the interposer 220. Additionally, or alternatively, if the IC die fails to satisfy the quality or reliability threshold, the IC die may be downgraded (e.g., "binned") and reallocated to another semiconductor package (or application) that requires a different quality threshold and/or reliability threshold. Additionally, or alternatively, if the electrically-conductive traces 225 of the interposer 220 are non-functional, one or more IC dies attached to the interposer 220 may be salvaged. Additionally, or alternatively, the testing operation 315 (or multiple iterations of the testing operation 315) may preserve a quality of the connection structures 250 for attaching the interposer 220 to a substrate (e.g., the substrate 240 of the semiconductor package 205, among other examples) to improve a yield of a product including the interposer 220 having the set of test contact structures 310.

FIG. 3B shows further details of the portion 305. In the side view of FIG. 3B, an IC die (e.g., the DRAM IC die 215) is electrically and/or mechanically connected to the interposer 220 using the connection structures 230. The electrically-conductive traces 225a (e.g., first electrically-conductive traces of the interposer 220) connect a circuitry of DRAM IC die 215 to the set of test contact structures 310. In some implementations, the circuitry connected to the set of test contact structures 310 corresponds to a test circuitry, such as a built in self-test (BIST) circuitry. In some implementations, the circuitry connected to the set of test contact structures 310 corresponds to a functional circuitry of the DRAM IC die 215 (e.g., "native" circuitry).

Additionally, and as shown in FIG. 3B, the electrically-conductive traces 225b (e.g., second electrically-conductive traces of the interposer 220) connect the DRAM IC die 215 to the connection structures 250. In some implementations, the circuitry connected to the connection structures 250 corresponds to the functional circuitry of the DRAM IC die 215.

The DRAM IC die 215 may be tested for a quality or reliability characteristic using a tool of the ATE tool set 120, such as a prober tool connected to test instrumentation, among other examples. To test the DRAM IC die 215, a probe needle 320 electrically connected to the test instrumentation (not shown in FIG. 3B) may make electrical contact with one or more of the set of test contact structures 310 to access circuitry of the DRAM IC die 215 (e.g., the BIST circuitry or the functional circuitry depending on a configuration of the DRAM IC die 215 and/or the ATE tool set 120, among other examples). The probe needle 320 may include a compliant pogo-pin, a compliant spring, or a compliant cantilever beam, among other examples. Additionally, or alternatively, the probe needle 320 may include a flat tip, a rounded tip, or a pointed tip, among other examples.

In some implementations, one or more of the test contact structures 310 includes a width D1. As an example, the width D1 may be included in a range of approximately 80 microns to approximately 500 microns. If the width D1 is less than approximately 80 microns, an available contact area may not be sufficient for an accuracy of the prober tool (e.g., a targeting accuracy of the probe needle 320). If the width D1 is greater than approximately 500 microns, the set of test contact structures 310 may reduce an amount of space available to other components and increase a cost of the semiconductor package 205. However, other values and ranges for the width D1 are within the scope of the present disclosure.

As shown in FIG. 3B, an edge of one or more of the set of test contact structures 310 may be a distance D2 from an edge of a seal ring structure 325 of the interposer 220 (e.g., a structure that prevents a propagation of cracks and or defects from edges of the interposer 220). As an example, the distance D2 may be included in a range of approximately 20 microns to approximately 1000 microns. If the distance D2 is less than approximately 20 microns, stresses proximate the set of test contact structures 310 may increase and cracking or damage to the electrically-conductive traces 225a may occur. If the distance is greater than approximately 1000 microns, spacing of the set of test contact structures 310 may be excessive and increase a cost of the semiconductor package 205. However, other values and ranges for the distance D2 are within the scope of the present disclosure.

The connection structures 230 of FIG. 3B include a width D3. In some implementations, a ratio of the width D1 to the width D3 (e.g., D1/D3) is included in a range of approximately 5:1 to approximately 10:1. If the ratio D1/D3 is less than approximately 5:1, an available contact area may not be sufficient for an accuracy of the prober tool (e.g., a targeting accuracy of the probe needle 320). If the ratio D1/D3 is greater than approximately 10:1, a large manufacturing variation that reduces a coplanarity of test contact structures 310 and/or the connection structures 230 may be present. Such a reduced coplanarity may decrease an effectiveness of the probe needle 320 contacting the set of test contact structures 310. Additionally, or alternatively, such a reduced coplanarity may reduce a solder joint reliability of the connection structures 230. However, other values and ranges for the ratio D1/D3 are within the scope of the present disclosure.

FIG. 3C shows a top view of the interposer 220 including the DRAM IC die 215. In some implementations, and as shown in FIG. 3C, the set of test contact structures 310a includes a single test contact structure. For example, the set of test contact structures 310a that includes the single test contact structure may be implemented with electrically-conductive traces (e.g., the electrically-conductive traces 225) leading to an input/output of the DRAM IC die 215 connected to test circuitry 335a of the DRAM IC die 215 (e.g., built-in self-test circuitry, among other examples). In such a case, an electrical signal 330a (e.g., an electrical current) may correspond to a bi-directional signal.

Additionally, or alternatively and as shown in FIG. 3C, the set of test contact structures 310b includes multiple test contact structures. For example, the set of test contact structures 310b that includes the multiple test contact structures may be implemented with electrically-conductive traces (e.g., the electrically-conductive traces 225) that connect to functional circuitry 335b of the DRAM IC die 215 (e.g., power, clocking, or memory cells, among other examples) and/or the interposer 220. In such a case, an electrical signal 330b (e.g., an electrical current) may correspond to a closed-loop signal.

Figure 3D:
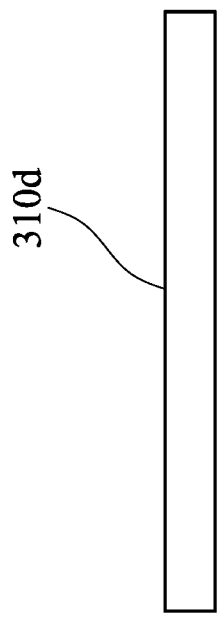
Figure 3D:
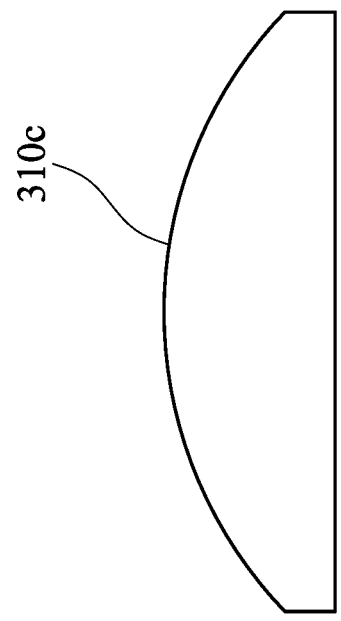

FIG. 3D shows side views of different examples of the set of test contact structures 310. As shown in the left side of FIG. 3D, the set of test contact structures 310c may include a bump or bump-shaped (e.g., a convex surface) structure. In a semiconductor package (e.g., the semiconductor package 205) including the set of test contact structures 310c, one or more of the set of test contact structures 310c may be directly covered by a mold compound (e.g., the mold compound 235).

As shown in the right side of FIG. 3D, the set of test contact structures 310d may include a pad or pad-shaped (e.g., a planar surface) structure. In a semiconductor package (e.g., the semiconductor package 205) including the set of test contact structures 310d, one or more of the set of test contact structures 310d may be directly covered by a mold compound (e.g., the mold compound 235).

As indicated above, FIGS. 3A-3D are provided as examples. Furthermore, and described in connection with FIGS. 4A-4C and elsewhere herein, there may be additional features, different features, or differently arranged features than those shown in FIGS. 3A-3D.

Figure 4A:
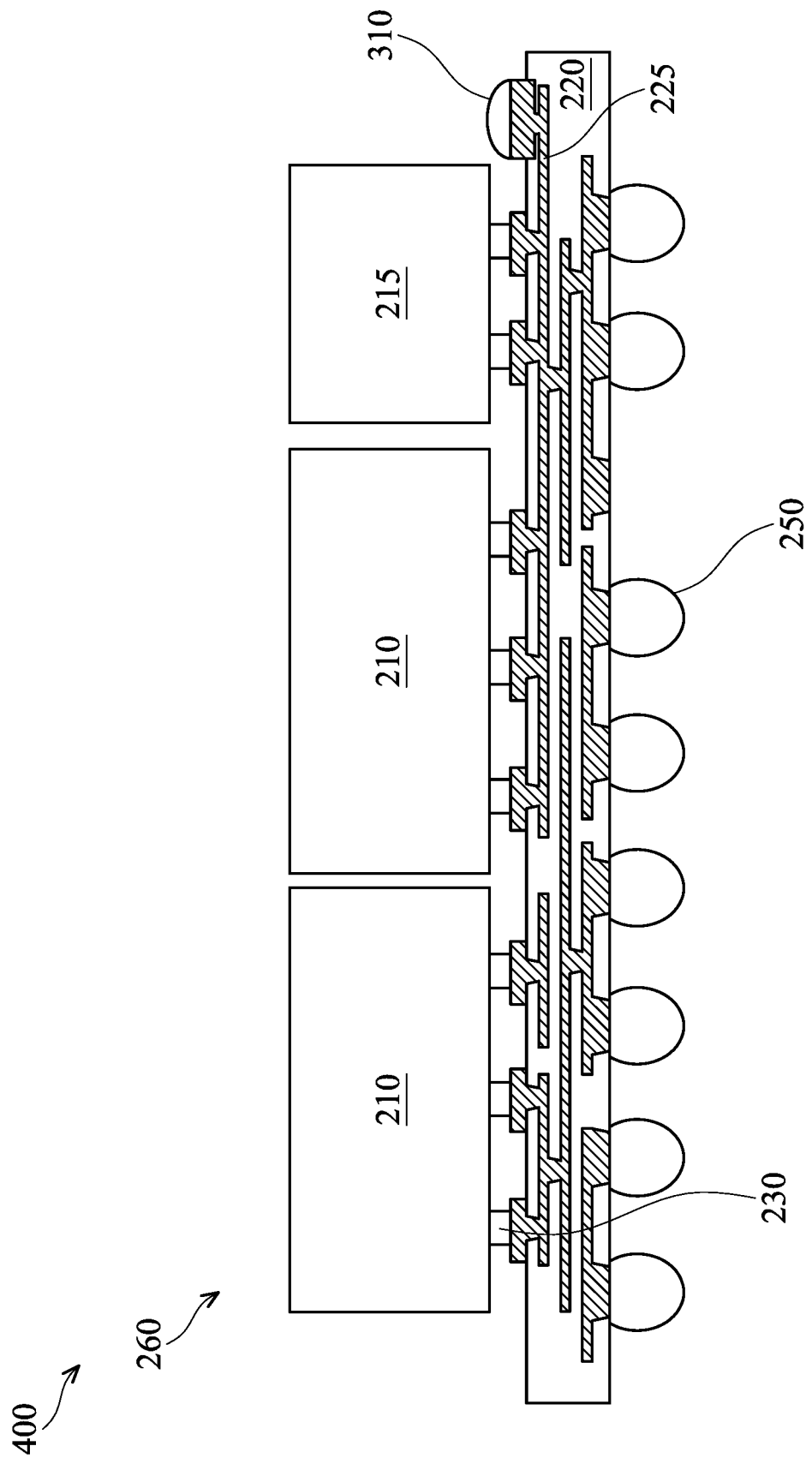
Figure 4B:
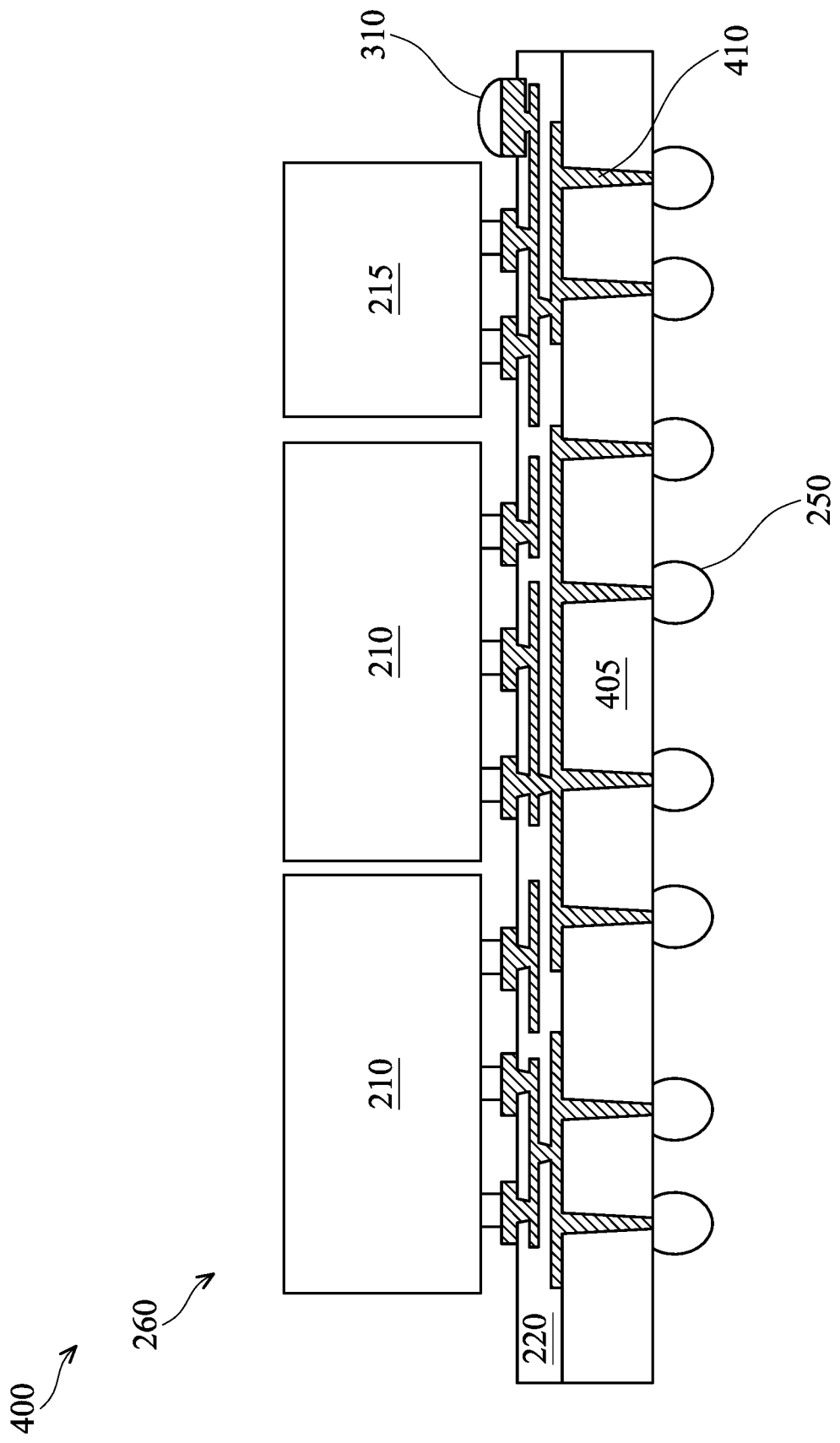
Figure 4C:
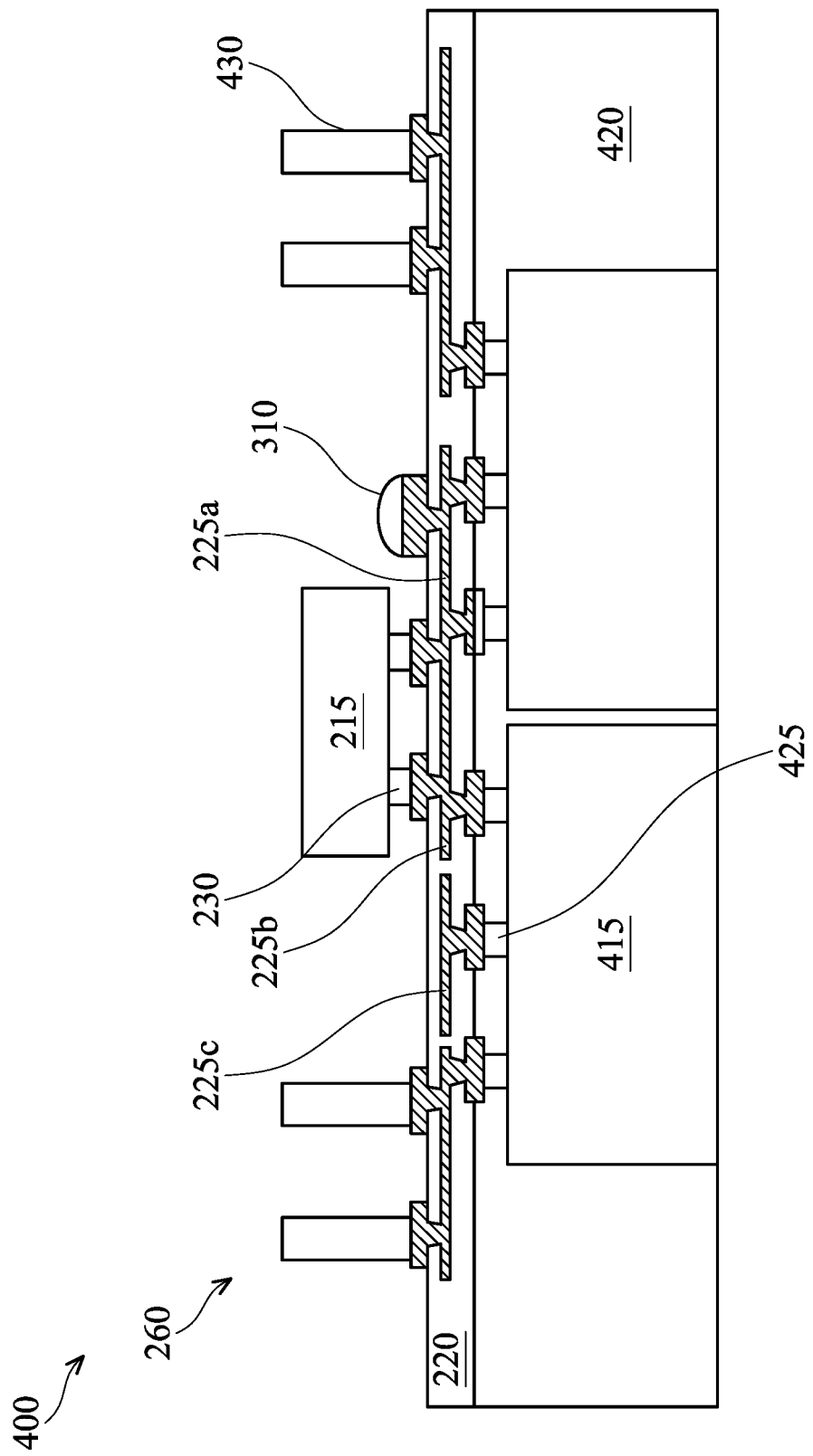

FIGS. 4A-4C are diagrams of one or more example implementations 400 described herein. The implementation 400 includes one or more example configurations of the semiconductor package 205 including the set of test contact structures 310. Furthermore, FIGS. 4A-4C represent side views of the region 260 of the semiconductor package 205.

In FIG. 4A, the region 260 may correspond to a portion of the semiconductor package 205 formed using a chip-on-wafer-on-substrate fabrication process including an organic interposer (CoWoS-R). As described in connection with FIGS. 5A-5G, one or more of the semiconductor processing tool sets 105-150 may perform a series of operations to form the region 260 of FIG. 4A.

As shown in FIG. 4A, the region 260 of the semiconductor package 205 includes the connection structures 230 (e.g., a first set of connection structures) between the interposer 220 and multiple IC dies (e.g., the SoC IC die(s) 210 and the DRAM IC die 215). In FIG. 4A, the interposer 220 may correspond to an organic interposer. Further, and as shown in FIG. 4A, the set of test contact structures 310 is adjacent to the DRAM IC die 215.

Additionally, the region 260 includes the connection structures 250 (e.g., a second set of connection structures) attached to a bottom surface of the interposer 220. The connection structures 250 may correspond to C4 connection structures and may be configured to attach the interposer 220 to a substrate (e.g., the substrate 240).

In some implementations, the set of test contact structures 310 may electrically-connect to more than one IC die. For example, the set of test contact structures 310 may electrically connect to the DRAM IC die 215 and one or more of the SoC IC dies 210 using the electrically-conductive traces 225.

Turning to FIG. 4B, the region 260 may correspond to a portion of the semiconductor package 205 formed using a chip-on-wafer-on-substrate fabrication process including a silicon interposer (CoWoS-S). The region 260 of FIG. 4B may be formed using the series of operations, or similar operations, performed by the semiconductor processing tool sets 105-150 as described in connection with FIGS. 5A-5G.

As shown in FIG. 4B, the region 260 of the semiconductor package 205 includes the connection structures 230 (e.g., a first set of connection structures) between the interposer 220 (e.g., a first interposer) and multiple IC dies (e.g., the SoC IC die(s) 210 and the DRAM IC die 215). The region further includes an interposer 405 (e.g., a second interposer) bonded to a bottom surface of the interposer 220. In FIG. 4B, the interposer 220 may include an organic interposer. Additionally, or alternatively, the interposer 220 may include a redistribution structure (e.g., one or more redistribution layers). In some implementations, the interposer 405 of FIG. 4B corresponds to a silicon substrate. Further, and as shown in FIG. 4A, the set of test contact structures 310 is adjacent to the DRAM IC die 215.

The interposer 405 includes electrically-conductive structures 410 (e.g., through-silicon vias, or TSVs) passing through the interposer 405. The electrically-conductive structures 410 may be electrically connected to the connection structures 250 (e.g., a second set of connection structures). The connection structures 250 may correspond to C4 connection structures and may be configured to attach the interposer 405 to a substrate (e.g., the substrate 240).

In some implementations, the interposer 405 and the interposer 220 combine to form a single interposer within a semiconductor package (e.g., the semiconductor package 205). In such a case, the interposer may include a redistribution structure (e.g., redistribution layers that form the interposer 220) over a silicon substrate (e.g., the interposer 405) and one or more vias (e.g., the TSVs).

In FIG. 4C, the region 260 may correspond to a portion of the semiconductor package 205 formed using an integrated fan-out fabrication process combined with a local silicon interconnect fabrication process (InFO-LSI). The region 260 of FIG. 4C may be formed using a series of operations performed by the semiconductor processing tool sets 105-150. Further, and as shown in FIG. 4C, the set of test contact structures 310 is adjacent to the DRAM IC die 215. The region 260 further includes the electrically-conductive traces 225a (e.g., first electrically-conductive traces of the interposer 220) and the electrically-conductive traces 225b (e.g., second electrically-conductive traces of the interposer 220).

In addition to the DRAM IC die 215 (e.g., a first IC die) on the top surface of the interposer 220 and the connection structures 230 (e.g. a first set of connection structures) between the DRAM IC die 215 and the interposer 220, the region 260 includes an IC die 415 (e.g., a second IC die) in an encapsulant 420 (e.g., in mold compound, among other examples) and a set of connection structures 425 (e.g., a second set of connection structures). The set of connection structures 425, as shown, are between a top surface of the IC die 415 and a bottom surface of the interposer 220. In some implementations, the set of connection structures 425 electrically connects the electrically-conductive traces 225c (e.g., third electrically-conductive traces of the interposer 220) to the IC die 415. As shown in FIG. 4C, the region 260 may also include one or more pillars 430 for additional electrical and/or mechanical connections. In some implementations, the pillars 430 include a gold (Au) material, a copper (Cu) material, a silver (Ag) material, a nickel (Ni) material, a tin (Sn) material, a lead (Pb) material, a palladium (Pd) material, a material composed of a combination of electrically-conductive materials, among other examples As indicated above, FIGS. 4A-4C are provided as examples. Other examples may differ from what is described with regard to FIGS. 4A-4C.

FIGS. 5A-5G are diagrams of an example implementation 500 described herein. The implementation 500 includes a series of operations that may be performed by one or more of the semiconductor processing tool sets 105-150 to form the semiconductor package 205 including the set of test contact structures 310. In some implementations, the series of operations corresponds to a chip-on-wafer-on-substrate (CoWoS) packaging process.

Figure 5A:
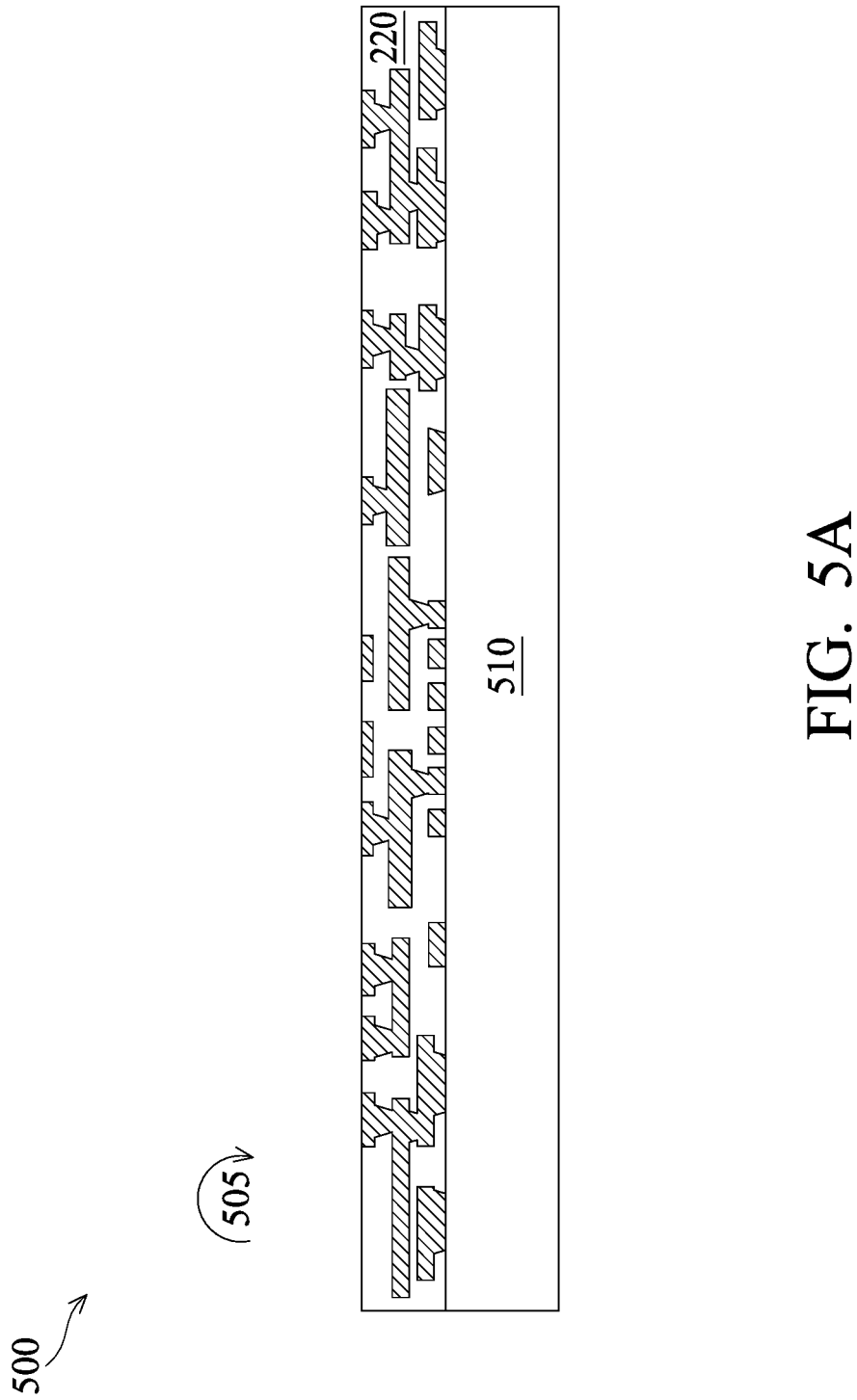

As shown in FIG. 5A, a semiconductor processing tool set (e.g., the RDL tool set 105 including the bonding tool, among other examples) may perform a series of operations 505 to bond a first carrier 510 to the interposer 220. Additionally, or alternatively, the semiconductor processing tool set may perform the series of operations 505 to form the interposer 220 on the first carrier 510 from one or more redistribution layers. In some implementations, a top surface of the first carrier 510 interfaces with a bottom surface of the interposer 220.

Figure 5B:
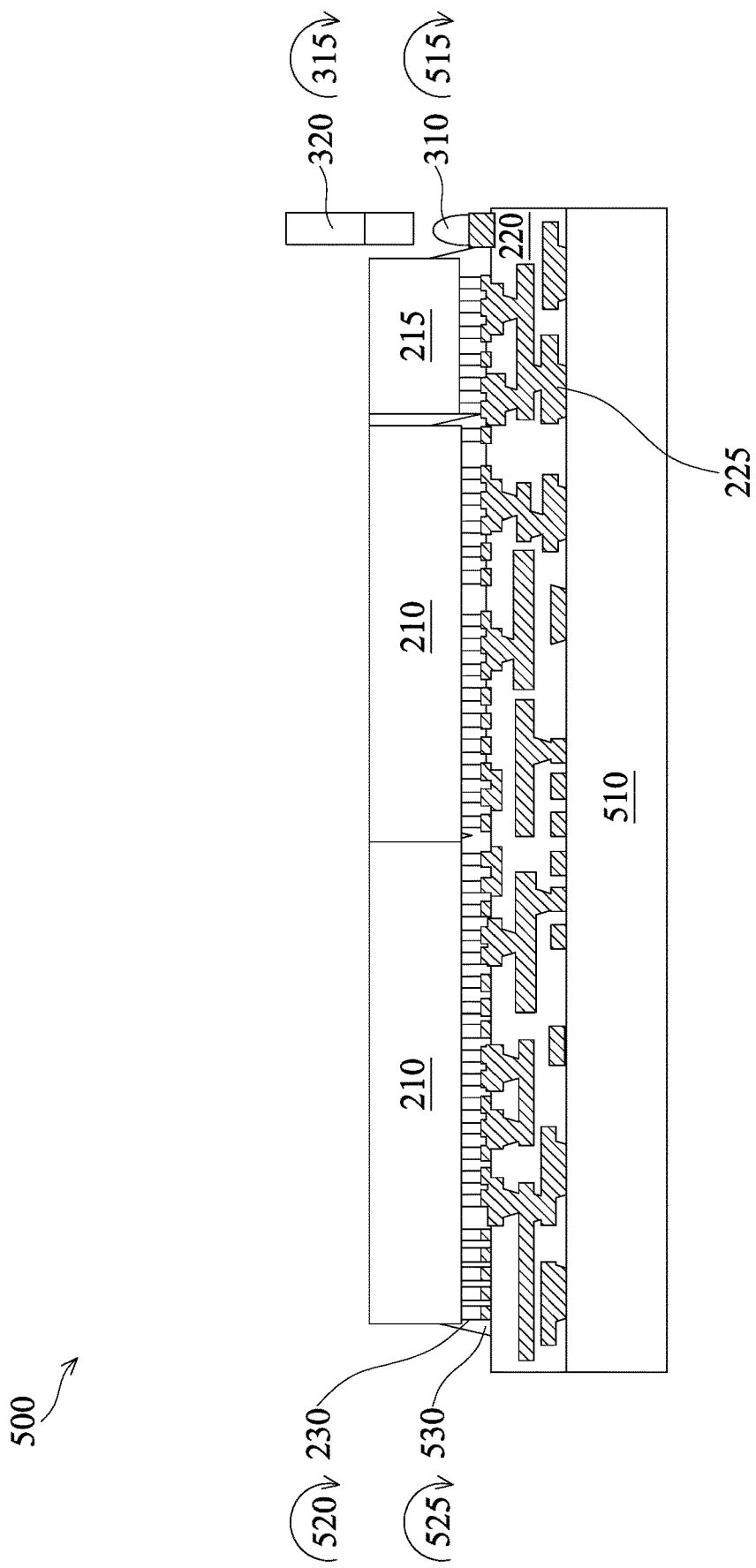

As shown in FIG. 5B, a semiconductor processing tool set (e.g., the interconnect tool set 115, among other examples) may perform a series of operations 515 to form the set of test contact structures 310 on the interposer 220. In some implementations, the set of test contact structures 310 may be formed concurrently with the connection structures 230 (e.g., a first set of connection structures) using a photolithography process and a plating process.

Also, as shown in FIG. 5B, another semiconductor processing tool set (e.g., the die-attach tool set 130 including the pick-and-place tool and the reflow tool, among other examples) may perform a series of operations 520 to attach IC dies (e.g., the SoC IC die(s) 210 and the DRAM IC die 215) to a top surface of the interposer 220 using the connection structures 230. Another semiconductor processing tool set (e.g., the encapsulation tool set 135 including the dispense tool, among other examples) may perform a series of operations 525 to dispense an underfill material 530 around the connection structures 230. The underfill material 530 may include an epoxy polymer material, among other examples. In some implementations, the underfill material 530 absorbs stresses and/or strains to increase a robustness of the connection structures 230.

As further shown in FIG. 5B, a semiconductor processing tool set (e.g., the ATE tool set 120 including the probe needle 320, among other examples) may perform a series of operations (e.g., including the testing operation 315) to test the IC dies using a set of test contact structures 310 attached to the top surface of the interposer 220 and adjacent the IC die. Additionally, or alternatively, the semiconductor processing tool set may perform the series of operations to test a functionality of the electrically-conductive traces 225 (e.g., opens and/or shorts of the electrically-conductive traces 225).

Additionally, or alternatively, the semiconductor processing tool set may determine that the IC dies satisfy a quality and/or reliability threshold based on a result of testing the IC dies, as described above. Additionally, or alternatively, the semiconductor processing tool set may determine that the electrically-conductive traces 225 satisfy a functionality threshold.

Figure 5C:
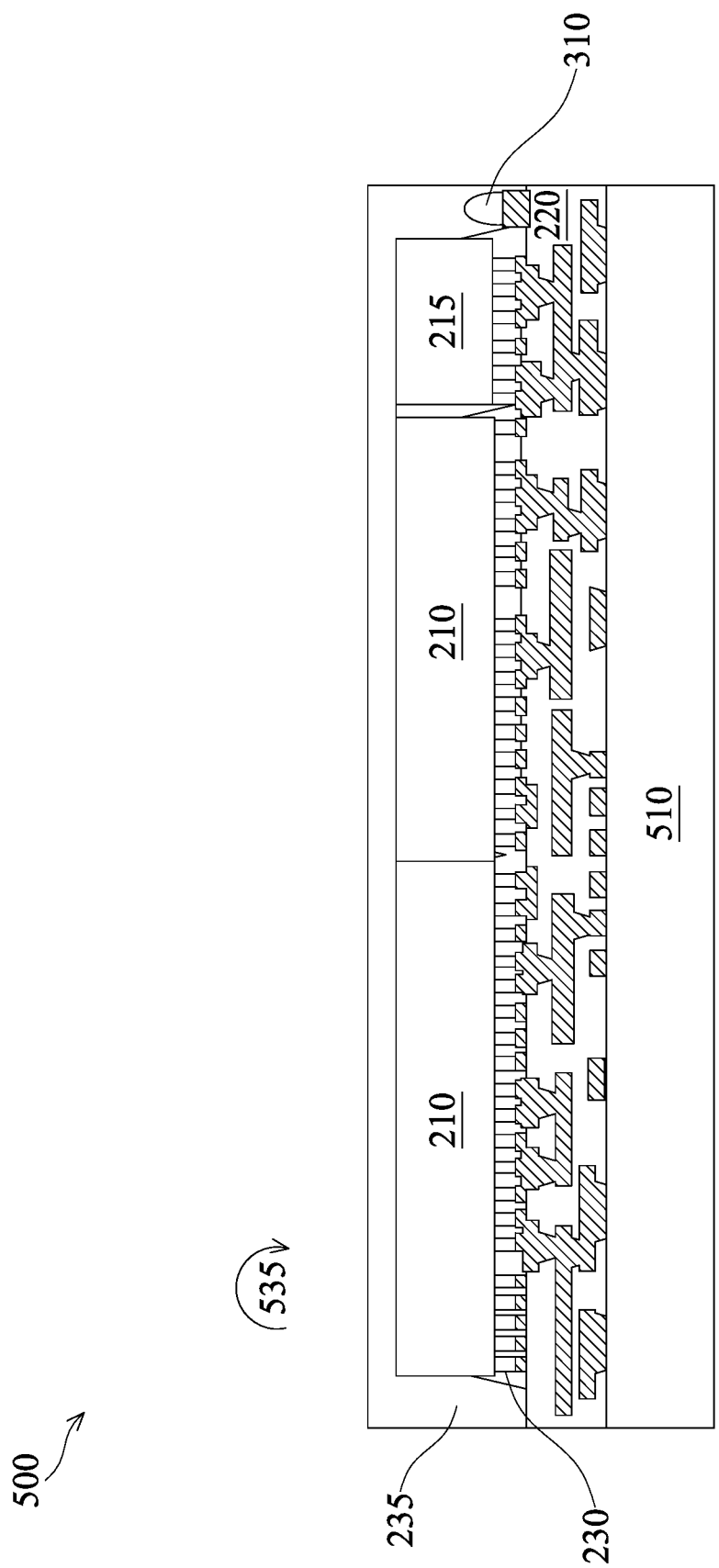

As shown in FIG. 5C, a semiconductor processing tool set (e.g., the encapsulation tool set 135, among other examples) may perform a series of operations 535 to encapsulate the IC dies, the connection structures 230, and the set of test contact structures 310 within the mold compound 235 (e.g., the set of test contact structures 310 is directly covered by the mold compound 235). In some implementations, the series of operations 535 is performed after determining that the IC dies satisfy the quality and/or reliability threshold, and/or after determining that the electrically-conductive traces 225 satisfy a functionality threshold.

Figure 5D:
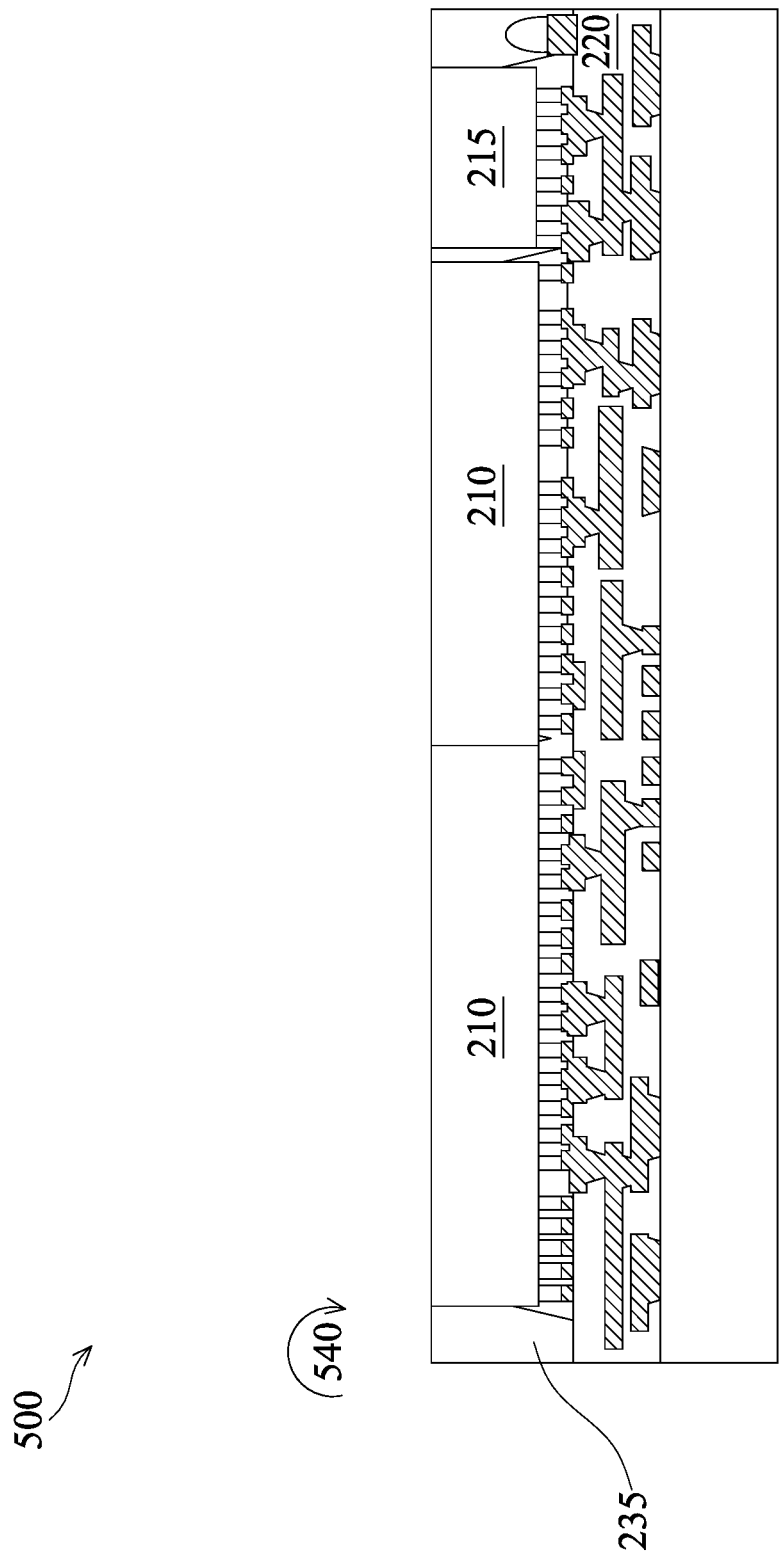

As shown in FIG. 5D, a semiconductor processing tool set (e.g., the planarization tool set 110) may perform a series of operations 540 to planarize the mold compound 235 to expose the IC dies.

Figure 5E:
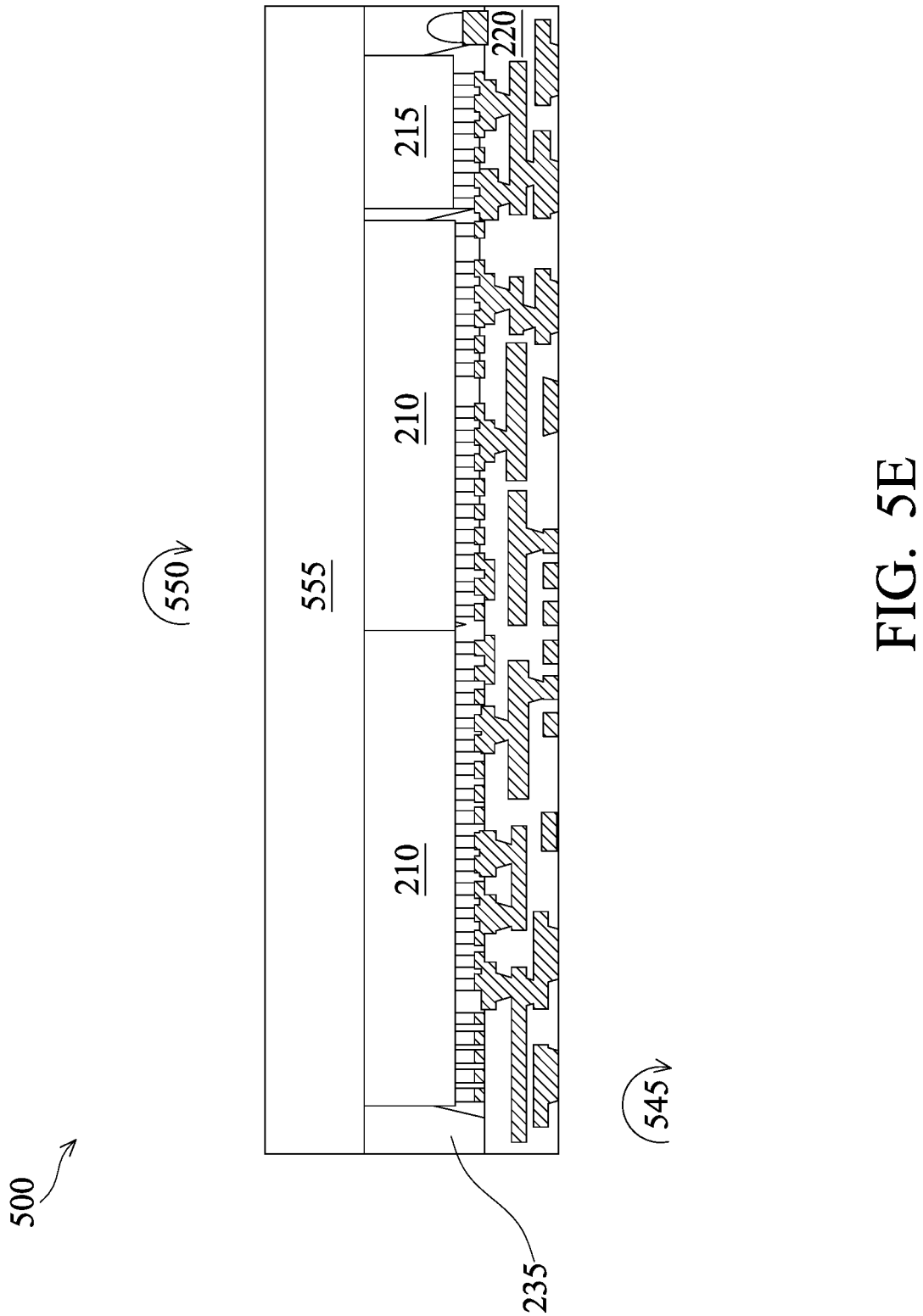

As shown in FIG. 5E, a semiconductor processing tool set (e.g., the RDL tool set 105 including the debonding tool, among other examples) may perform a series of operations 545 to debond the first carrier 510 from the interposer 220. Additionally, and as shown in FIG. 5E, the semiconductor processing tool set (e.g., the RDL tool set 105 including the bonding tool) may perform a series of operations 550 to bond a second carrier 555 to the mold compound 235. In some implementations, a top surface of the mold compound 235 and a top surface of the IC dies interface with a bottom surface of the second carrier 555.

Figure 5F:
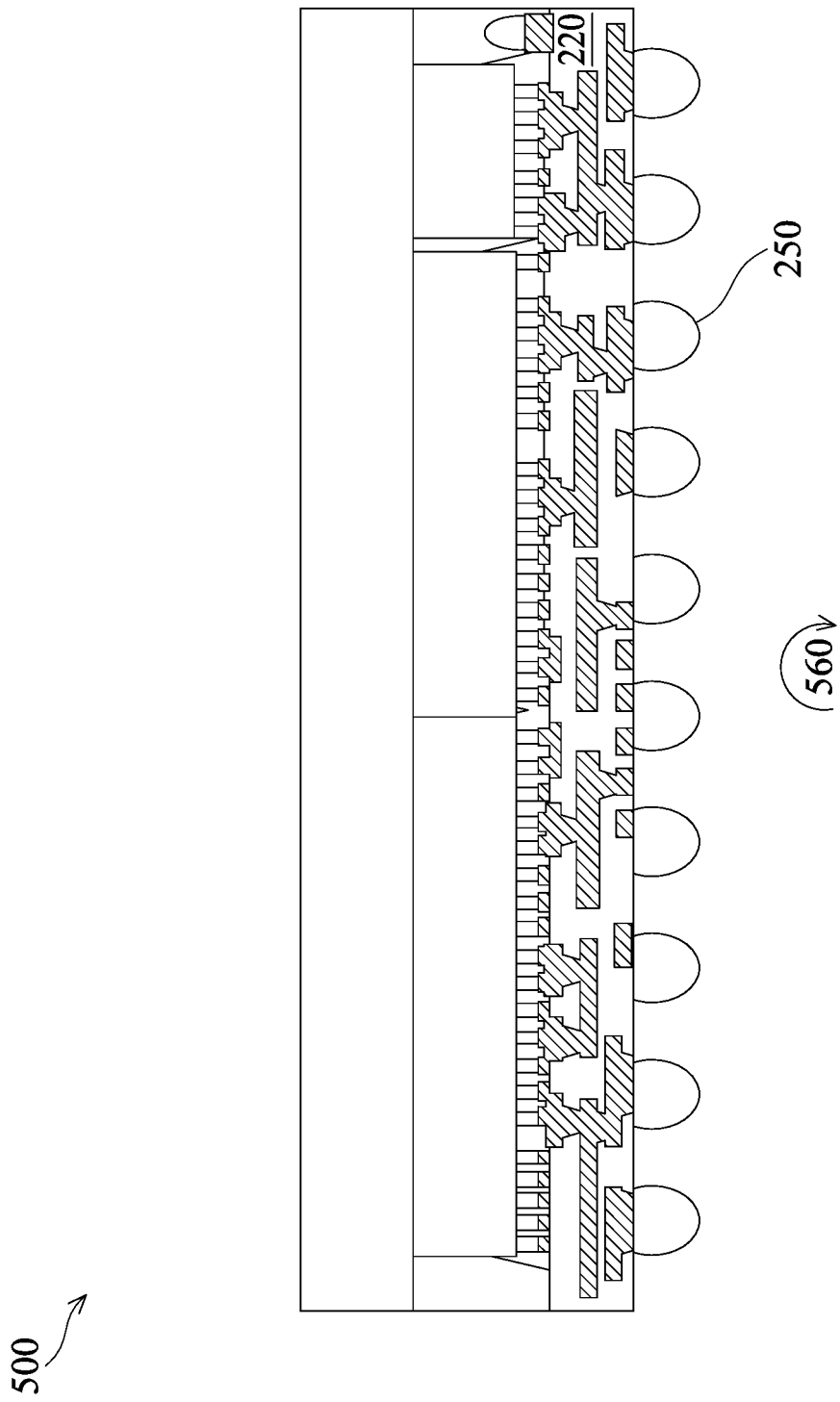

As shown in FIG. 5F, a semiconductor processing tool set (e.g., the interconnect tool set 115, among other examples) may perform a series of operations 560 to form the connection structures 250 (e.g., a second set of connection structures) on a bottom surface of the interposer 220.

Figure 5G:
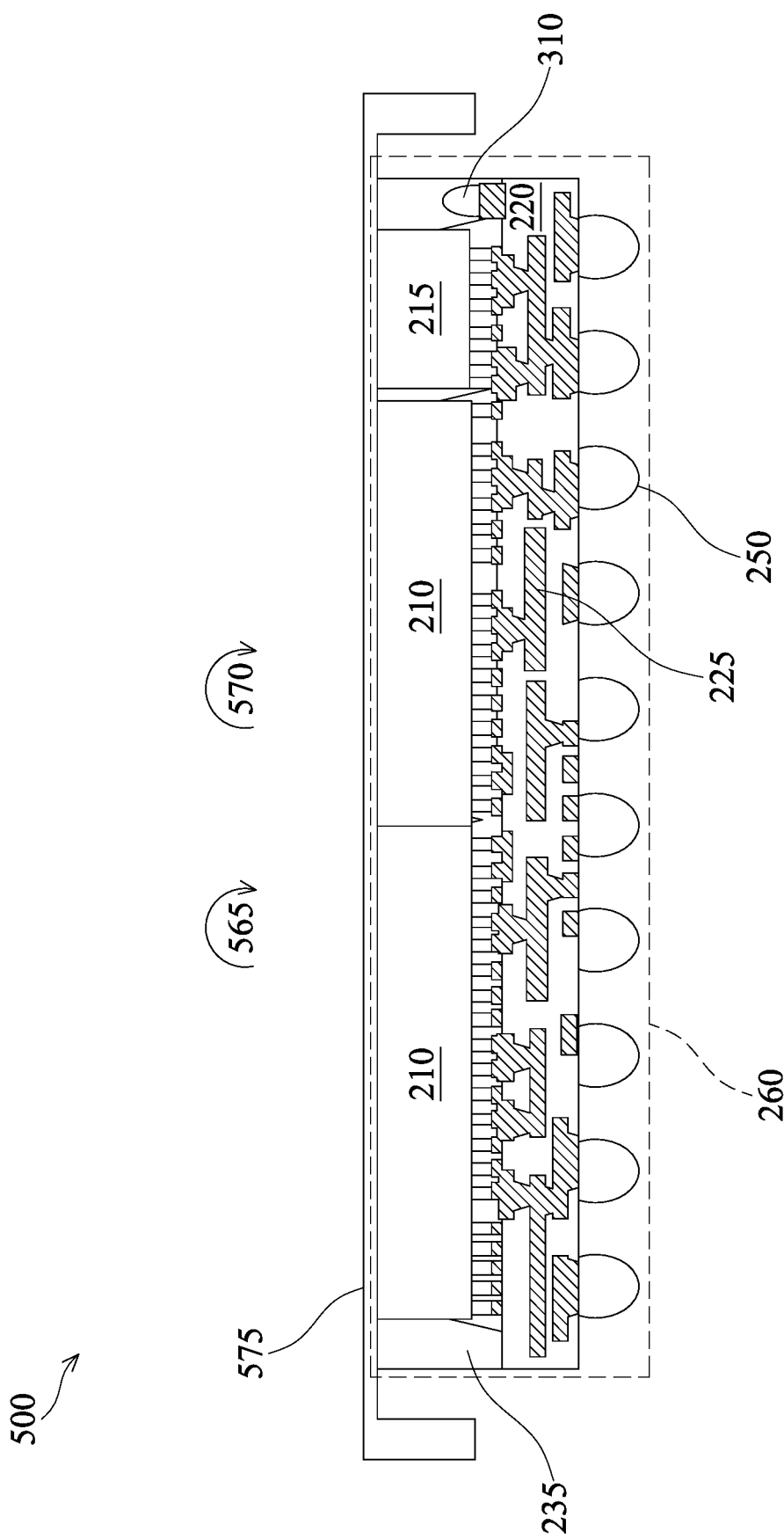

As shown in FIG. 5G, a semiconductor processing tool set (e.g., the RDL tool set 105 including the debonding tool, among other examples) may perform a series of operations 565 to debond the second carrier 555 from the IC dies and the mold compound 235. Additionally, and as shown in FIG.

5G, a semiconductor processing tool set (e.g., the singulation tool set 125 including the pick-and-place tool, among other examples) may perform a series of operations 570 to transfer a portion of a semiconductor package (e.g., corresponding to the region 260 of the semiconductor package 205) to a film-frame carrier 575 for additional processing (e.g., attaching the interposer 220 to the substrate 240).

After the operations described in connection with FIGS. 5A-5G, the mold compound 235 encapsulates tested IC dies (e.g., the SoC IC die(s) 210 and/or the DRAM IC die 215), an interposer including tested traces (e.g., the interposer 220 and the electrically-conductive traces 225) and a set of test contact structures (e.g., the set of test contact structures 310). Probing and damaging the connection structures 250 has been avoided, thereby improving a reliability and/or a quality of solder joints subsequently formed using the connection structures 250 to attach the interposer 220 to a substrate (e.g., the substrate 240).

The operations provided by FIGS. 5A-5G are provided as examples. In practice, there may be additional operations, different operations, or differently arranged operations than those shown in FIGS. 5A-5G.

Figure 6:
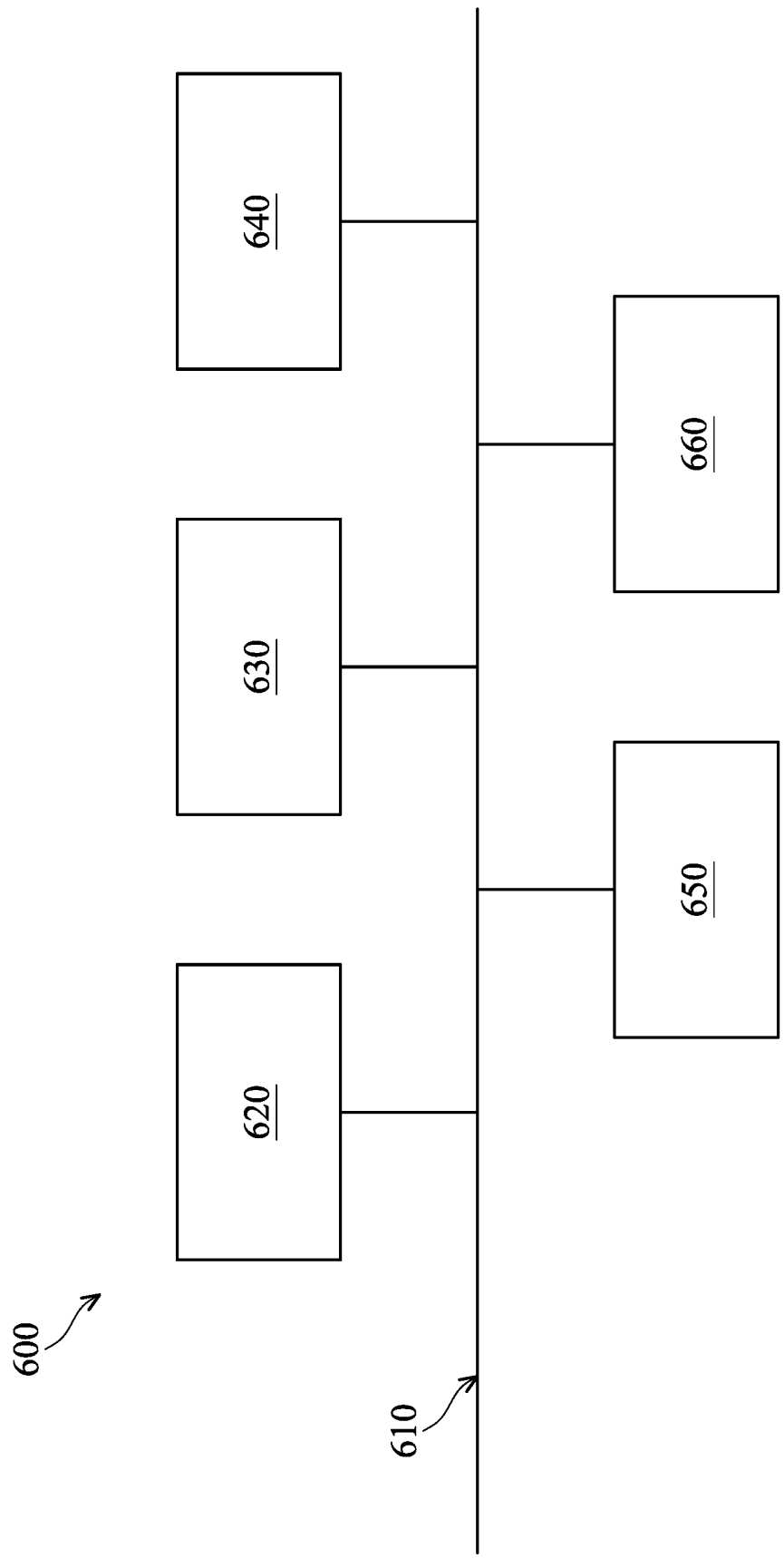
FIG. 6 is a diagram of example components of one or more devices of FIG. 1 described herein.

FIG. 6 is a diagram of example components of a device 600, which may correspond to one or more of the semiconductor processing tool sets 105-150. In some implementations, the semiconductor processing tool sets 105-150 include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
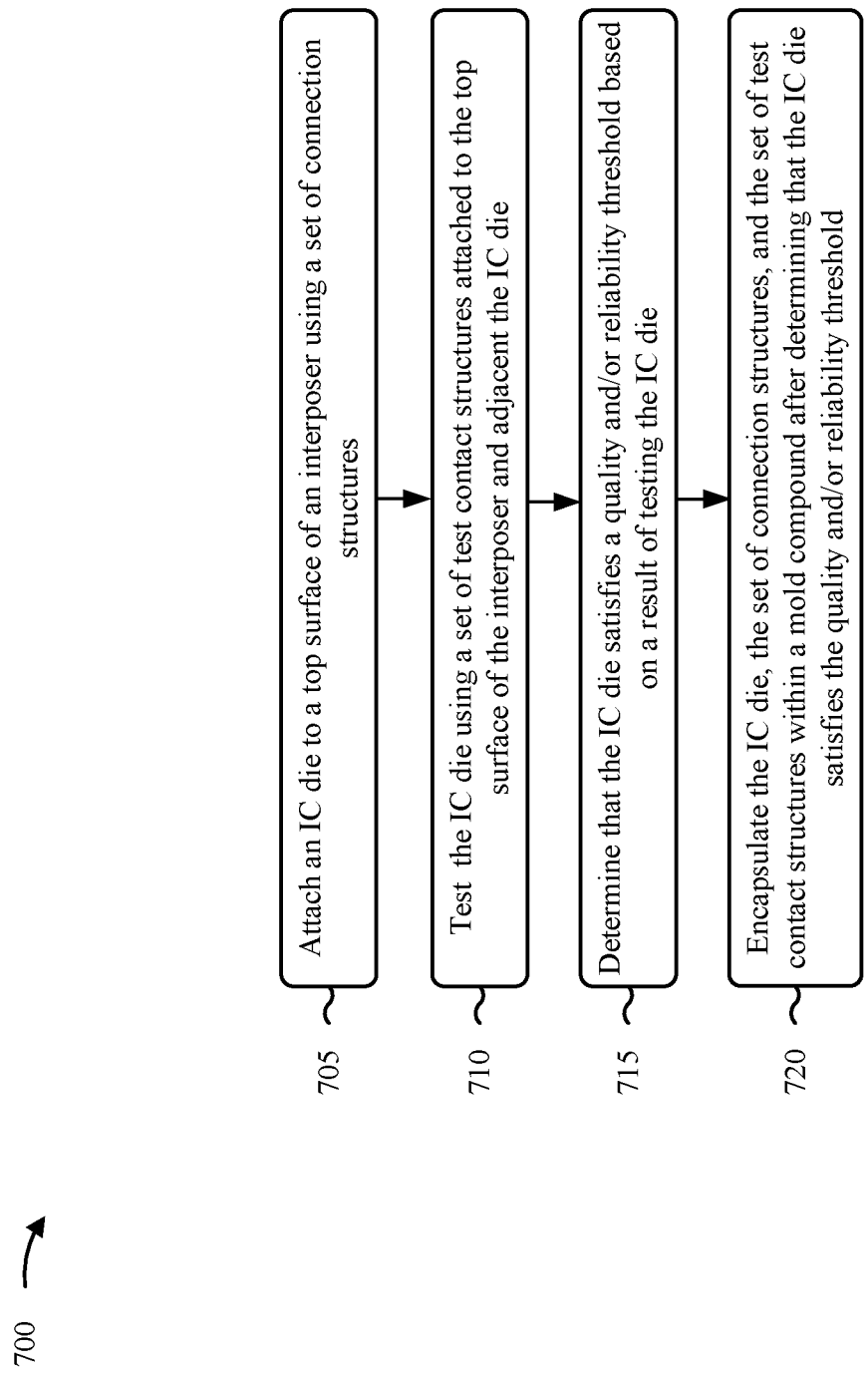
FIGS. 7 and 8 are flowcharts of processes associated with forming a semiconductor package described herein.

FIG. 7 is a flowchart of an example process associated with forming a semiconductor package described herein. In some implementations, one or more process blocks of FIG. 7 are performed by one or more of the semiconductor processing tool sets 105-150. Additionally, or alternatively, one or more process blocks of FIG. 7 may be performed by one or more components of device 600, such as processor 620, memory 630, input component 640, output component 650, and/or communication component 660.

As shown in FIG. 7, process 700 may include attaching an integrated circuit die to a top surface of an interposer using a set of connection structures (block 705). For example, one or more of semiconductor processing tool sets 105-150, such as the die-attach tool set 130, may attach an IC die (e.g., the DRAM IC die 215) to a top surface of an interposer 220 using a set of connection structures 230, as described above. In some implementations, the set of connection structures 230 electrically connects first circuitry of the IC die to first electrically-conductive traces 225b of the interposer.

As further shown in FIG. 7, process 700 may include testing the integrated circuit die using a set of test contact structures attached to the top surface of the interposer and adjacent the integrated circuit die (block 710). For example, one or more of the semiconductor processing tool sets 105-150, such as the ATE tool set 120, may test the IC die using a set of test contact structures 310 attached to the top surface of the interposer 220 and adjacent the IC die, as described above. In some implementations, the set of test contact structures 310 electrically connects to second circuitry of the IC die through second electrically-conductive traces 225a of the interposer 220.

As further shown in FIG. 7, process 700 may include determining that the IC die satisfies a quality and/or reliability threshold based on a result of testing the integrated circuit die (block 715). For example, one or more of the semiconductor processing tool sets 105-150, such as the ATE tool set 120, may determine that the IC die satisfies a quality and/or reliability threshold based on a result of testing the IC die, as described above.

As further shown in FIG. 7, process 700 may include encapsulating the integrated circuit die, the set of connection structures, and the set of test contact structures within a mold compound after determining that the integrated circuit die satisfies the quality and/or reliability threshold (block 720). For example, one or more of the semiconductor processing tool sets 105-150, such as the encapsulation tool set 135, may encapsulate the IC die, the set of connection structures 230, and the set of test contact structures 310 within a mold compound 235 after determining that the IC die satisfies the quality and/or reliability threshold, as described above.

Process 700 may include additional implementations, such as any single implementation or any combination of implementations described below and/or in connection with one or more other processes described elsewhere herein.

In a first implementation, testing the IC die using the set of test contact structures 310 includes testing the IC die using a probe needle 320 to contact at least one of the set of test contact structures 310.

In a second implementation, alone or in combination with the first implementation, the first circuitry corresponds to a functional circuitry of the IC die and the second circuitry corresponds to a built-in self-test circuitry of the IC die.

In a third implementation, alone or in combination with one or more of the first and second implementations, process 700 includes testing a functionality of the first electrically-conductive traces 225b and/or a functionality of the second electrically-conductive traces 225a. Testing the functionality of the first electrically-conductive traces and/or the functionality of the second electrically-conductive traces may include testing for electrical opens and/or electrical shorts.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Figure 8:
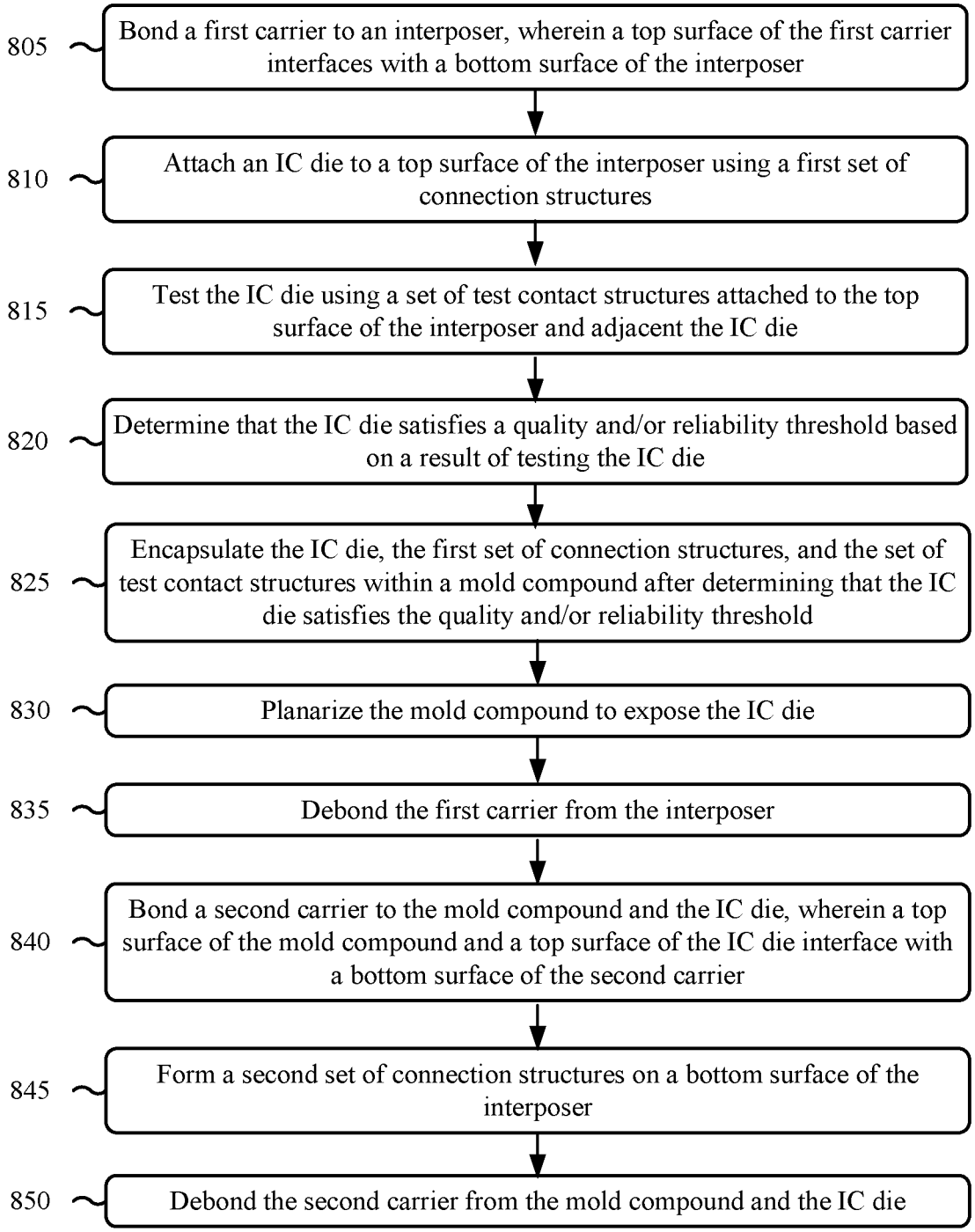

FIG. 8 is a flowchart of an example process associated with forming a semiconductor package described herein. In some implementations, one or more process blocks of FIG. 8 are performed by one or more of the semiconductor processing tool sets 105-150. Additionally, or alternatively, one or more process blocks of FIG. 8 may be performed by one or more components of device 600, such as processor 620, memory 630, input component 640, output component 650, and/or communication component 660.

As shown in FIG. 8, process 800 may include bonding a first carrier to an interposer (block 805). For example, one or more of the semiconductor processing tool sets 105-150, such the RDL tool set 105 (e.g., the bonding tool of the RDL tool set 105), may perform a series of operations 505 to bond a first carrier 510 to an interposer 220, as described above. In some implementations, a top surface of the first carrier 510 interfaces with a bottom surface of the interposer 220.

As further shown in FIG. 8, process 800 may include attaching an integrated circuit die to a top surface of the interposer using a first set of connection structures (block 810). For example, one or more of the semiconductor processing tool sets 105-150, such as the die-attach tool set 130, may perform a series of operations 520 to attach an IC die (e.g., the DRAM IC die 215) to a top surface of the interposer 220 using a first set of connection structures 230, as described above.

As further shown in FIG. 8, process 800 may include testing the IC die using a set of test contact structures attached to the top surface of the interposer and adjacent the IC die (block 815). For example, one or more of the semiconductor processing tool sets 105-150, such as the ATE tool set 120 including the probe needle 320, may perform a series of operations (e.g., including the testing operation 315) to test the IC die using a set of test contact structures 310 attached to the top surface of the interposer 220 and adjacent the IC die, as described above.

As further shown in FIG. 8, process 800 may include determining that the IC die satisfies a quality and/or reliability threshold based on a result of testing the integrated circuit die (block 820). For example, one or more of the semiconductor processing tool sets 105-150, such as the ATE tool set 120, may determine that the IC die satisfies a quality and/or reliability threshold based on a result of testing the IC die, as described above.

As further shown in FIG. 8, process 800 may include encapsulating the IC die, the first set of connection structures, and the set of test contact structures within a mold compound after determining that the integrated circuit die satisfies the quality and/or reliability threshold (block 825). For example, one or more of the semiconductor processing tool sets 105-150, such as the encapsulation tool set 135, may perform as series of operations 535 to encapsulate IC die, the first set of connection structures 230, and the set of test contact structures 310 within a mold compound 235 after determining that the IC die satisfies the quality and/or reliability threshold, as described above.

As further shown in FIG. 8, process 800 may include planarizing the mold compound to expose the IC die (block 830). For example, one or more of the semiconductor processing tool sets 105-150, such as the planarization tool set 110, may perform a series of operations 540 to planarize the mold compound 235 to expose the IC die, as described above.

As further shown in FIG. 8, process 800 may include debonding the first carrier from the interposer (block 835). For example, one or more of the semiconductor processing tool sets 105-150, such as the RDL tool set 105 (e.g., the debonding tool of the RDL tool set 105), may perform a series of operations 545 to debond the first carrier 510 from the interposer 220, as described above.

As further shown in FIG. 8, process 800 may include bonding a second carrier to the mold compound and the integrated circuit die (block 840). For example, one or more of the semiconductor processing tool sets 105-150, such as the RDL tool set (e.g., the bonding tool of the RDL tool set), may perform a series of operations 550 to bond a second carrier 555 to the mold compound 235 and the IC die, as described above. In some implementations, a top surface of the mold compound 235 and a top surface of the IC die interface with a bottom surface of the second carrier 555.

As further shown in FIG. 8, process 800 may include forming a second set of connection structures on a bottom surface of the interposer (block 845). For example, one or more of the semiconductor processing tool sets 105-150, such as the interconnect tool set 115, may perform a series of operations 560 to form a second set of connection structures 250 on a bottom surface of the interposer 220, as described above.

As further shown in FIG. 8, process 800 may include debonding the second carrier from the mold compound and the integrated circuit die (block 850). For example, one or more of the semiconductor processing tool sets 105-150, such as the RDL tool set 105 including the debonding tool, may perform a series of operations 565 to debond the second carrier 555 from the mold compound 235 and the IC die, as described above.

Process 800 may include additional implementations, such as any single implementation or any combination of implementations described below and/or in connection with one or more other processes described elsewhere herein.

In a first implementation, process 800 includes forming the set of test contact structures 310 on the interposer 220 prior to attaching the IC die.

In a second implementation, alone or in combination with the first implementation, process 800 includes forming the set of test contact structures 310 concurrently with forming the first set of connection structures 230 using a photolithography process and a plating process.

In a third implementation, alone or in combination with one or more of the first and second implementations, process 800 includes forming the set of test contact structures 310 on the interposer 220 after attaching the IC die.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations herein describe a semiconductor package. The semiconductor package, which may correspond to a high-performance computing (HPC) package, includes an IC die electrically and/or mechanically connected to a top surface of an interposer and a plurality of connection structures electrically and/or mechanically connected to a bottom surface of the interposer. The top surface of the interposer includes a set of test contact structures (e.g., one or more test bumps) that are electrically connected to the IC die through traces of the interposer. The set of test structures may be contacted by a probe needle to test a quality and/or a reliability of the IC die, as well as verify that traces of the interposer are functional. The set of test contact structures allows the IC die and traces of the interposer to be tested without probing the connection structures.

In this way, damage to the connection structures from probing may be avoided to improve a reliability and/or a quality of solder joints between the connection structures and a substrate to which the interposer is subsequently mounted. As such, a yield of the semiconductor package including the set of test contact structures may improve and a cost of the semiconductor package including the set of test contact structures may decrease.

As described in greater detail above, some implementations described herein provide a semiconductor package. The semiconductor package includes an integrated circuit die having a bottom surface. The semiconductor package includes an interposer having a top surface. The semiconductor package includes a set of connection structures between the top surface of the interposer and the bottom surface of the integrated circuit die, where the set of connection structures electrically connects first electrically-conductive traces of the interposer to the integrated circuit die. The semiconductor package includes a set of test contact structures attached to the top surface of the interposer, where the set of test contact structures and the integrated circuit die are disposed side by side, and where the set of test contact structures electrically connects to the integrated circuit die through second electrically-conductive traces of the interposer.

As described in greater detail above, some implementations described herein provide a method. The method includes attaching an IC die to a top surface of an interposer using a set of connection structures, where the set of connection structures electrically connects first circuitry of the IC die to first electrically-conductive traces of the interposer. The method includes testing the IC die using a set of test contact structures attached to the top surface of the interposer and adjacent the IC die, where the set of test contact structures electrically connects to second circuitry of the integrated circuit die through second electrically-conductive traces of the interposer. The method includes determining that the IC die satisfies a quality and/or reliability threshold based on a result of testing the IC die. The method includes encapsulating the IC die, the set of connection structures, and the set of test contact structures within a mold compound after determining that the integrated circuit die satisfies the quality and/or reliability threshold.

As described in greater detail above, some implementations described herein provide a method. The method includes bonding a first carrier to an interposer, where a top surface of the first carrier interfaces with a bottom surface of the interposer. The method includes attaching an IC die to a top surface of the interposer using a first set of connection structures. The method includes testing the IC die using a set of test contact structures attached to the top surface of the interposer and adjacent the integrated circuit die. The method includes determining that the IC die satisfies a quality and/or reliability threshold based on a result of testing the IC die. The method encapsulating the IC die, the first set of connection structures, and the set of test contact structures within a mold compound after determining that the IC die satisfies the quality and/or reliability threshold. The method includes planarizing the mold compound to expose the IC die. The method includes debonding the first carrier from the interposer. The method includes bonding a second carrier to the mold compound and the IC die, where a top surface of the mold compound and a top surface of the IC die interface with a bottom surface of the second carrier. The method includes forming a second set of connection structures on a bottom surface of the interposer. The method includes debonding the second carrier from the mold compound and the IC die.

As used herein, the term "and/or," when used in connection with a plurality of items, is intended to cover each of the plurality of items alone and any and all combinations of the plurality of items. For example, "A and/or B" covers "A and B," "A and not B," and "B and not A."

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
an integrated circuit die comprising a bottom surface;
an interposer comprising a top surface;
a set of connection structures between the top surface of the interposer and the bottom surface of the integrated circuit die,
wherein the set of connection structures electrically connects first electrically-conductive traces of the integrated circuit die to the interposer; and
a set of test contact structures attached to the top surface of the interposer, wherein the set of test contact structures and the integrated circuit die are disposed side by side,
wherein the set of test contact structures electrically connects to the interposer through second electrically-conductive traces of the integrated circuit die.

2. The semiconductor package of claim 1, wherein a width of a test contact structure, of the set of test contact structures, is in a range of approximately 80 microns to approximately 500 microns.

3. The semiconductor package of claim 1, wherein a distance of an edge of a test contact structure, of the set of test contact structures, from an edge of a seal ring of the interposer is included in a range of approximately 20 microns to approximately 1000 microns.

4. The semiconductor package of claim 1, wherein a ratio of a width of a test contact structure, of the set of test contact structures, to a width of a connection structure, of the set of connection structures, is included in a range of approximately 5:1 to approximately 10:1.

5. The semiconductor package of claim 1, wherein the set of test contact structures comprises:
a gold material, a copper material, a silver material, a nickel material, a tin material, a lead material, or a palladium material.

6. The semiconductor package of claim 1, wherein a material of the set of test contact structures is different from a material of the set of connection structures.

7. The semiconductor package of claim 1, wherein set of test contact structures electrically connect to functional circuitry of the integrated circuit die or to test circuitry of the integrated circuit die.

8. The semiconductor package of claim 1, wherein a test contact structure, of the set of test contact structures, comprises a bump directly covered by a mold compound.

9. The semiconductor package of claim 1, wherein a test contact structure, of the set of test contact structures, comprises a pad directly covered by a mold compound.

10. The semiconductor package of claim 1, wherein the set of connection structures corresponds to a first set of connection structures, and
wherein the semiconductor package further comprises a second set of connection structures attached to a bottom surface of the interposer,
wherein the second set of connection structures is configured to connect the interposer to a substrate.

11. The semiconductor package of claim 1, wherein the interposer comprises a silicon substrate, one or more vias passing through the silicon substrate, and a redistribution structure over the silicon substrate and the one or more vias.

12. The semiconductor package of claim 1, wherein the integrated circuit die corresponds to a first integrated circuit die, and the semiconductor package further comprises:
a second integrated circuit die electrically connected to the set of test contact structures.

13. A method, comprising:
attaching an integrated circuit die to a top surface of an interposer using a set of connection structures,
wherein the set of connection structures electrically connects first electrically-conductive traces of the integrated circuit die to the interposer;
testing the integrated circuit die using a set of test contact structures attached to the top surface of the interposer and adjacent the integrated circuit die,
wherein the set of test contact structures electrically connects to the interposer through second electrically-conductive traces of the integrated circuit die;
determining that the integrated circuit die satisfies a quality and/or reliability threshold based on a result of testing the integrated circuit die; and
encapsulating the integrated circuit die, the set of connection structures, and the set of test contact structures within a mold compound after determining that the integrated circuit die satisfies the quality and/or reliability threshold.

14. The method of claim 13, wherein testing the integrated circuit die using the set of test contact structures comprises:
testing the integrated circuit die using a probe needle to contact at least one of the set of test contact structures.

15. The method of claim 13, wherein at least one of:
a width of a test contact structure, of the set of test contact structures, is in a range of approximately 80 microns to approximately 500 microns,
a distance of an edge of a test contact structure, of the set of test contact structures, from an edge of a seal ring of the interposer is included in a range of approximately 20 microns to approximately 1000 microns, or
a ratio of a width of a test contact structure, of the set of test contact structures, to a width of a connection structure, of the set of connection structures, is included in a range of approximately 5:1 to approximately 10:1.

16. The method of claim 13, wherein the set of test contact structures comprises:
a gold material, a copper material, a silver material, a nickel material, a tin material, a lead material, or a palladium material.

17. A method, comprising:
bonding a first carrier to an interposer,
wherein a top surface of the first carrier interfaces with a bottom surface of the interposer;
attaching an integrated circuit die to a top surface of the interposer using a first set of connection structures;
testing the integrated circuit die using a set of test contact structures attached to the top surface of the interposer and adjacent the integrated circuit die;
determining that the integrated circuit die satisfies a quality and/or reliability threshold based on a result of testing the integrated circuit die;
encapsulating the integrated circuit die, the first set of connection structures, and the set of test contact structures within a mold compound after determining that the integrated circuit die satisfies the quality and/or reliability threshold;
planarizing the mold compound to expose the integrated circuit die;
debonding the first carrier from the interposer;
bonding a second carrier to the mold compound and the integrated circuit die, wherein a top surface of the mold compound and a top surface of the integrated circuit die interface with a bottom surface of the second carrier;

forming a second set of connection structures on a bottom surface of the interposer; and debonding the second carrier from the mold compound and the integrated circuit die.

18. The method of claim 17, further comprising:

forming the set of test contact structures on the interposer prior to attaching the integrated circuit die.

19. The method of claim 18, wherein forming the test contact structures on the interposer prior to attaching the integrated circuit die comprises:

forming the set of test contact structures concurrently with forming the first set of connection structures using a photolithography process and a plating process.

20. The method of claim 17, further comprising:

forming the set of test contact structures on the interposer after attaching the integrated circuit die.

\* \* \* \* \*